(12) United States Patent
Scatchard et al.

(10) Patent No.: US 10,410,975 B1
(45) Date of Patent: Sep. 10, 2019

(54) PROCESSED WAFER OF SCALABLE ELECTRICAL CIRCUITS, METHOD FOR MAKING SAME, AND DEVICE COMPRISING SCALED ELECTRICAL CIRCUITS

(71) Applicant: MICROSEMI SOLUTIONS (U.S.), INC., Aliso Viejo, CA (US)

(72) Inventors: Bruce Scatchard, Anmore (CA); Peter Onufryk, Flanders, NJ (US); Chunfang Xie, Coquitlam (CA)

(73) Assignee: MICROSEMI SOLUTIONS (U.S.), INC., Aliso Viejo, CA (US)

( * ) Notice: Subject to any disclaimer, the term of this patent is extended or adjusted under 35 U.S.C. 154(b) by 0 days.

(21) Appl. No.: 14/845,975

(22) Filed: Sep. 4, 2015

(51) Int. Cl.
*H01L 27/00* (2006.01)
*H01L 23/00* (2006.01)
*H01L 21/78* (2006.01)

(52) U.S. Cl.
CPC ............ *H01L 23/562* (2013.01); *H01L 21/78* (2013.01)

(58) Field of Classification Search
CPC . H01L 23/562; H01L 23/528; H01L 23/5225; H01L 21/78
See application file for complete search history.

(56) References Cited

U.S. PATENT DOCUMENTS

| 7,122,403 B2 | 10/2006 | Chandran et al. | |
| 8,227,904 B2 | 7/2012 | Braunisch et al. | |
| 2006/0055007 A1* | 3/2006 | Yao | B28D 5/0011 257/660 |
| 2006/0076651 A1* | 4/2006 | Tsutsue | H01L 23/562 257/620 |
| 2009/0294897 A1* | 12/2009 | Lee | H01L 23/5225 257/509 |
| 2011/0073996 A1 | 3/2011 | Leung et al. | |
| 2014/0035106 A1* | 2/2014 | Vu | H01L 23/544 257/620 |
| 2014/0070380 A1 | 3/2014 | Chiu et al. | |
| 2014/0117552 A1 | 5/2014 | Qian et al. | |

OTHER PUBLICATIONS

Lapedus, "One-On-One: Mark Bohr", Semiconductor Engineering, Sep. 18, 2014, pp. 1-9.

* cited by examiner

*Primary Examiner* — Dale E Page
*Assistant Examiner* — Quovaunda V Jefferson
(74) *Attorney, Agent, or Firm* — Leber IP Law; David C Robertson

(57) ABSTRACT

A processed semiconductor wafer has layered elements that define electrical circuits and a double-seal ring surrounding each individual electrical circuit. The layered elements further define another double-seal ring that surrounds at least two electrical circuits. The processed semiconductor wafer can have additional layered elements that extend each of the double-seal rings that surround individual circuits or, that can extend the other double-seal ring. A method of fabricating such a processed semiconductor wafer. A device comprising two such electrical circuits.

16 Claims, 26 Drawing Sheets

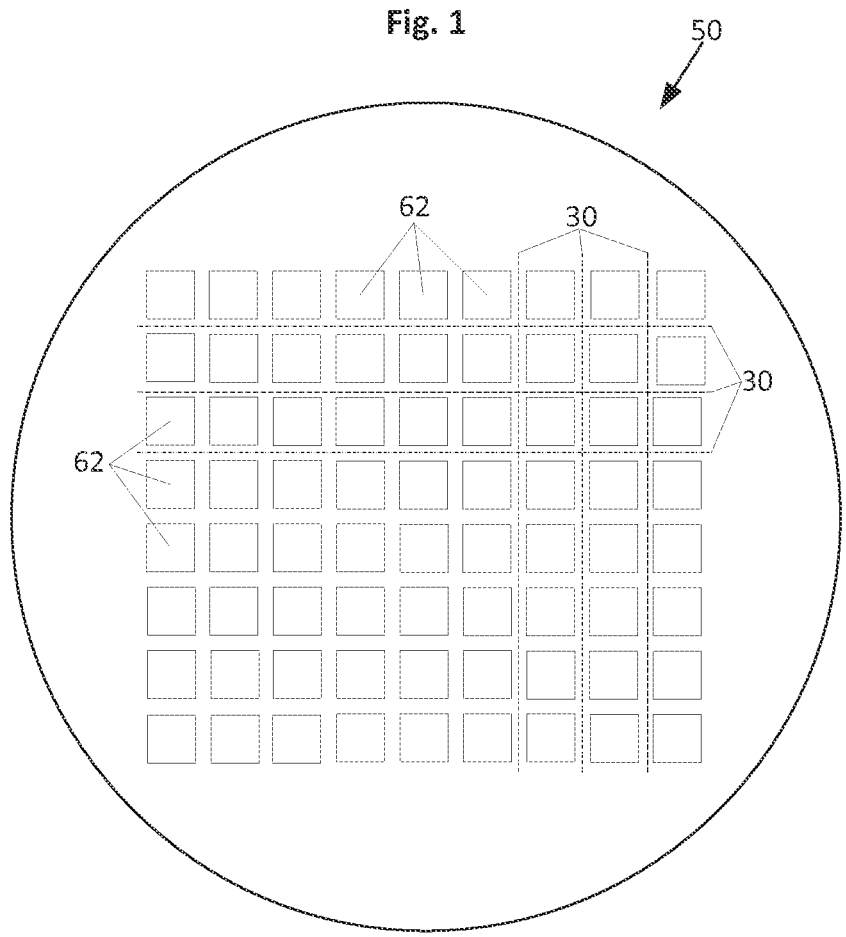

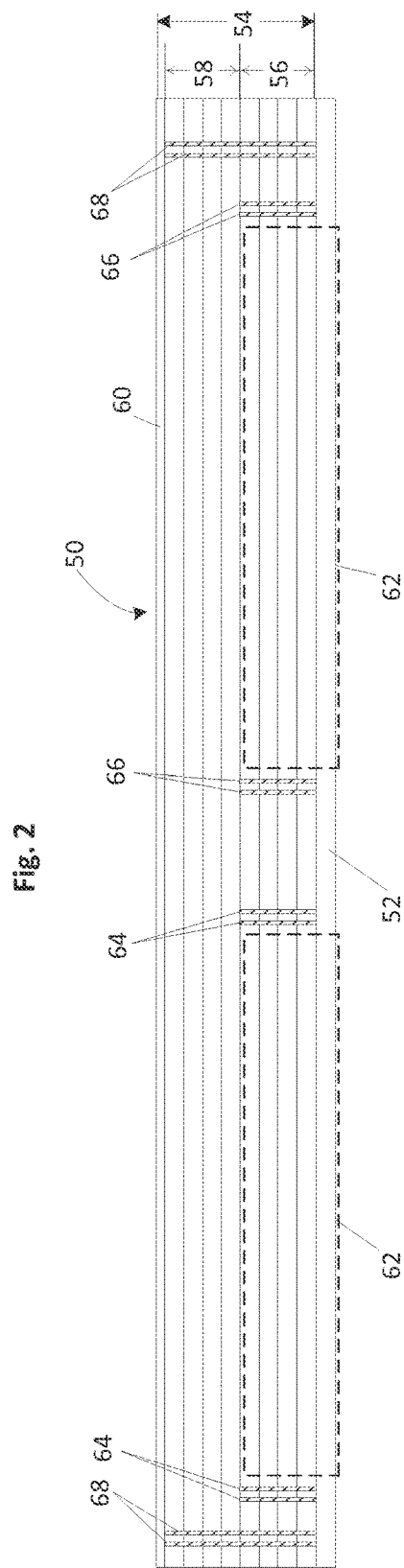

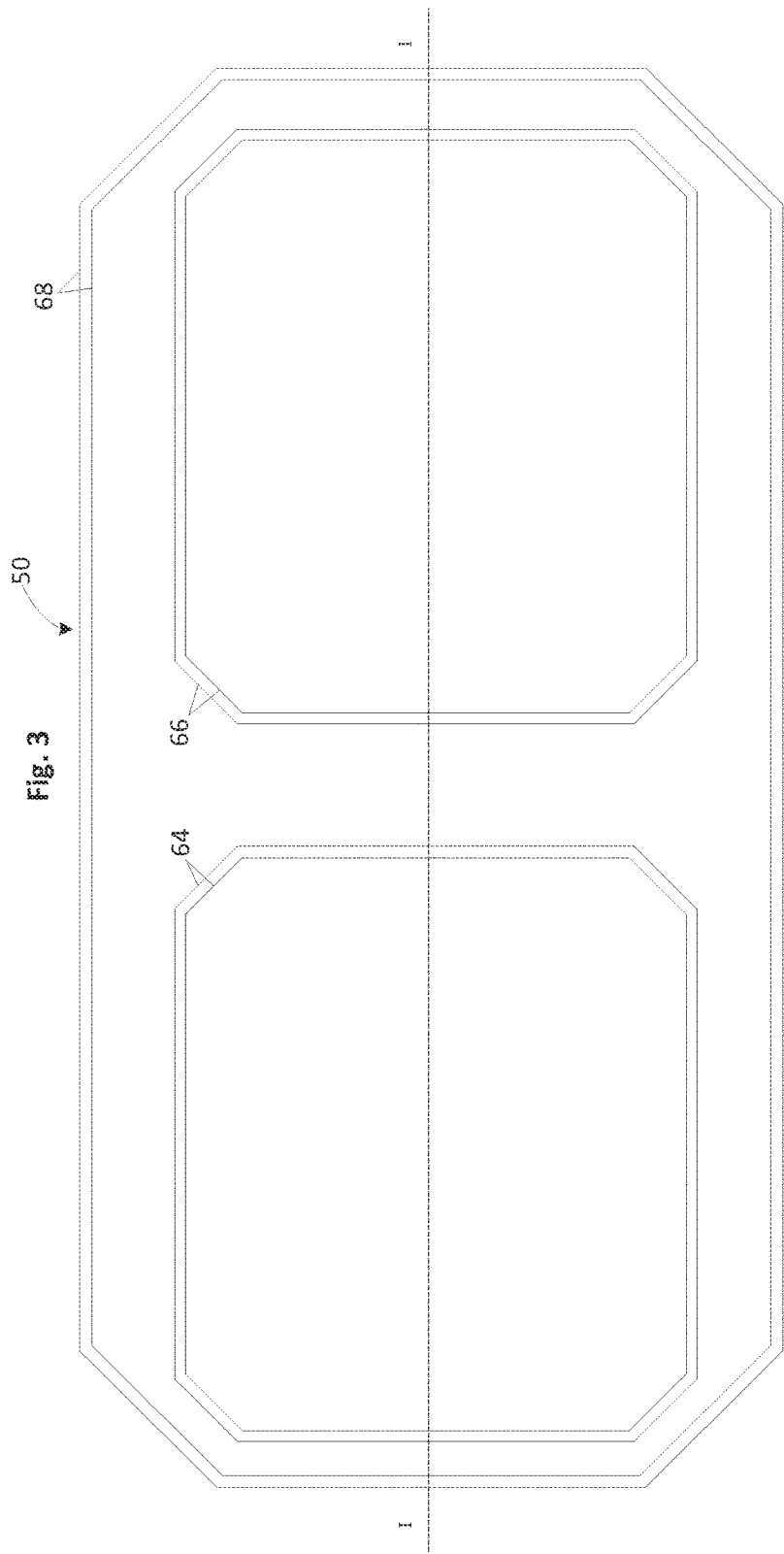

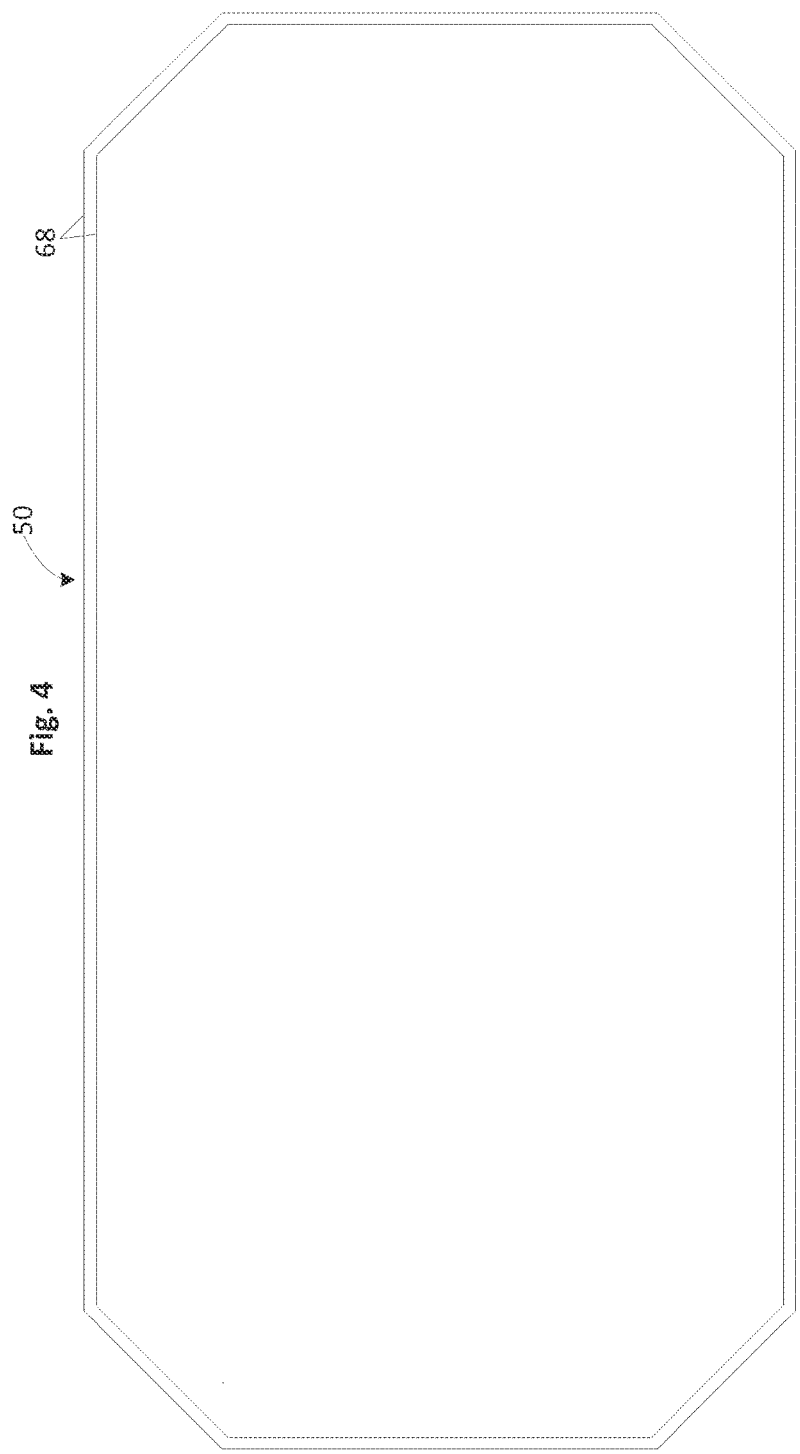

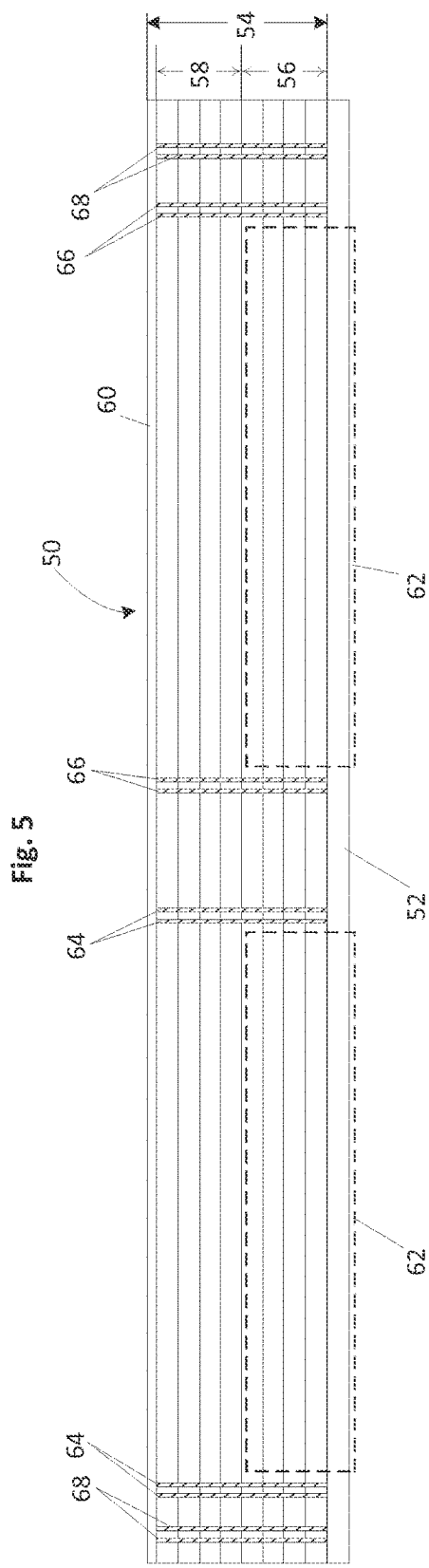

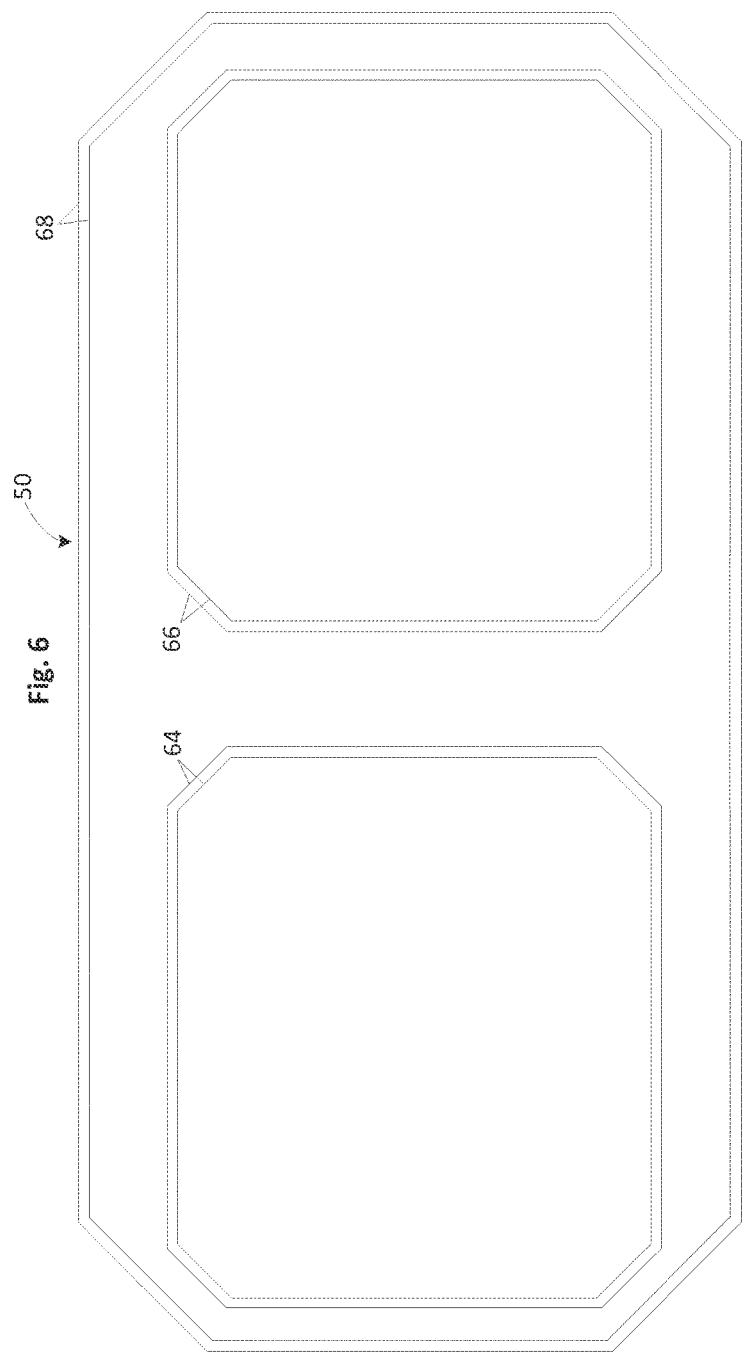

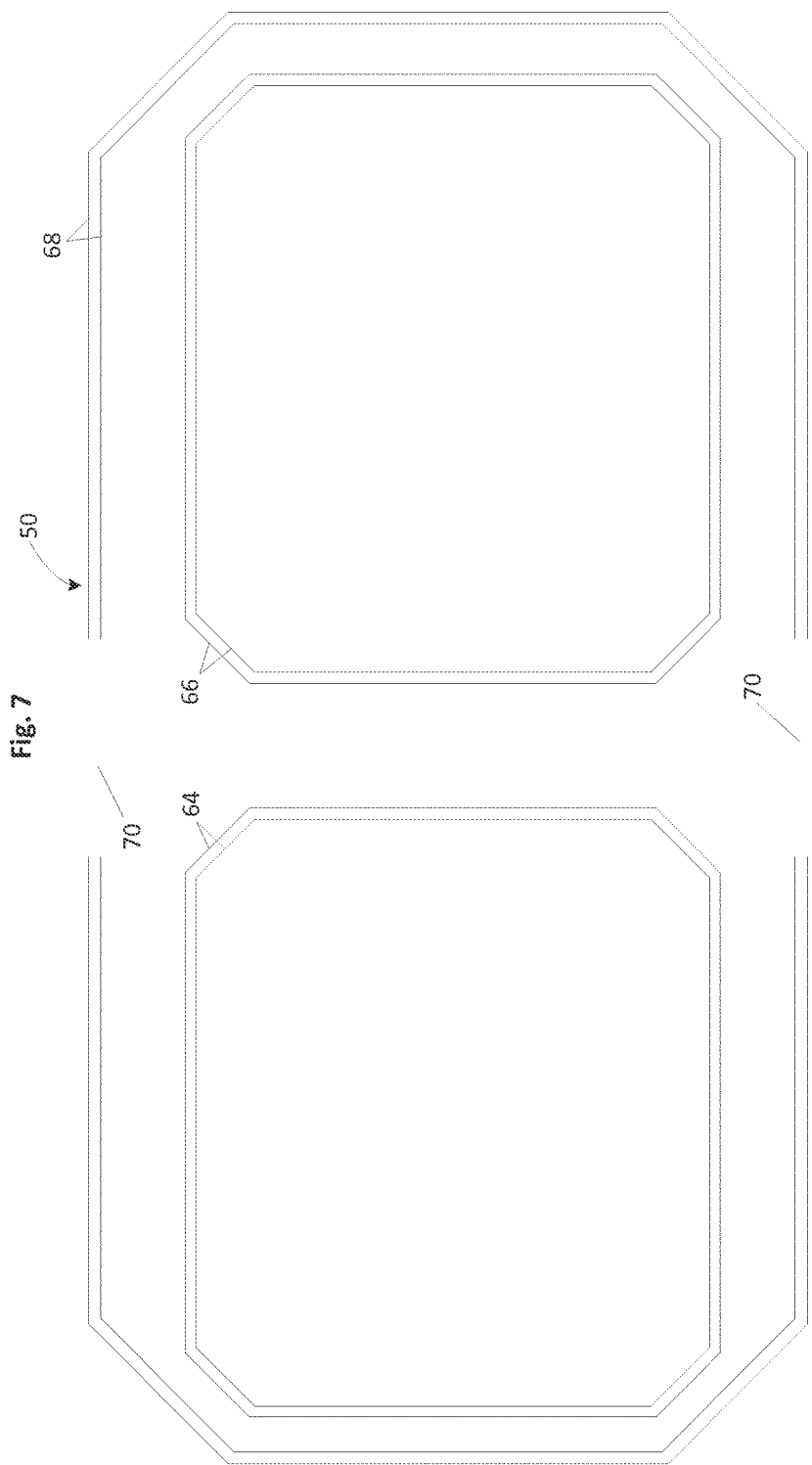

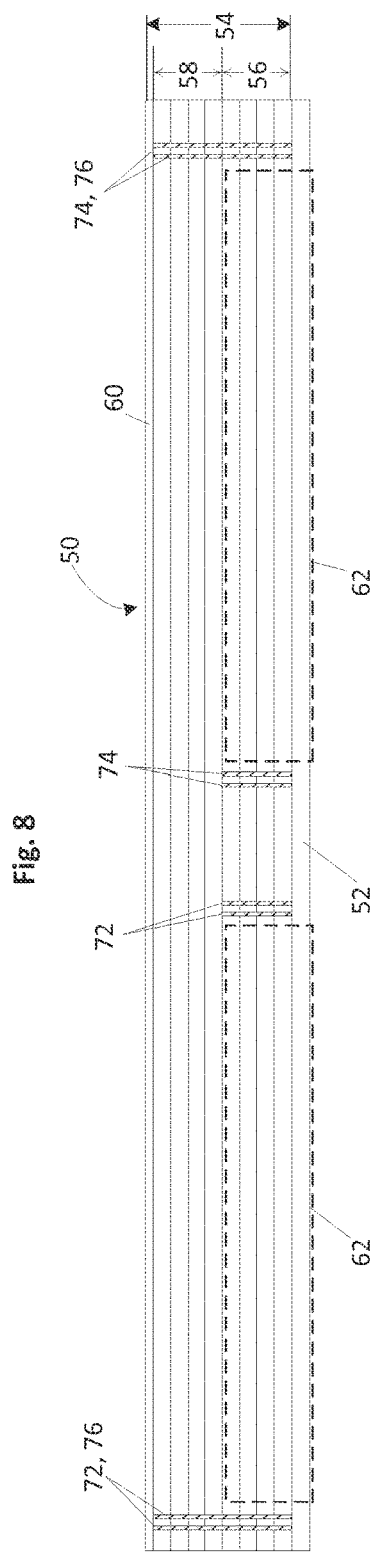

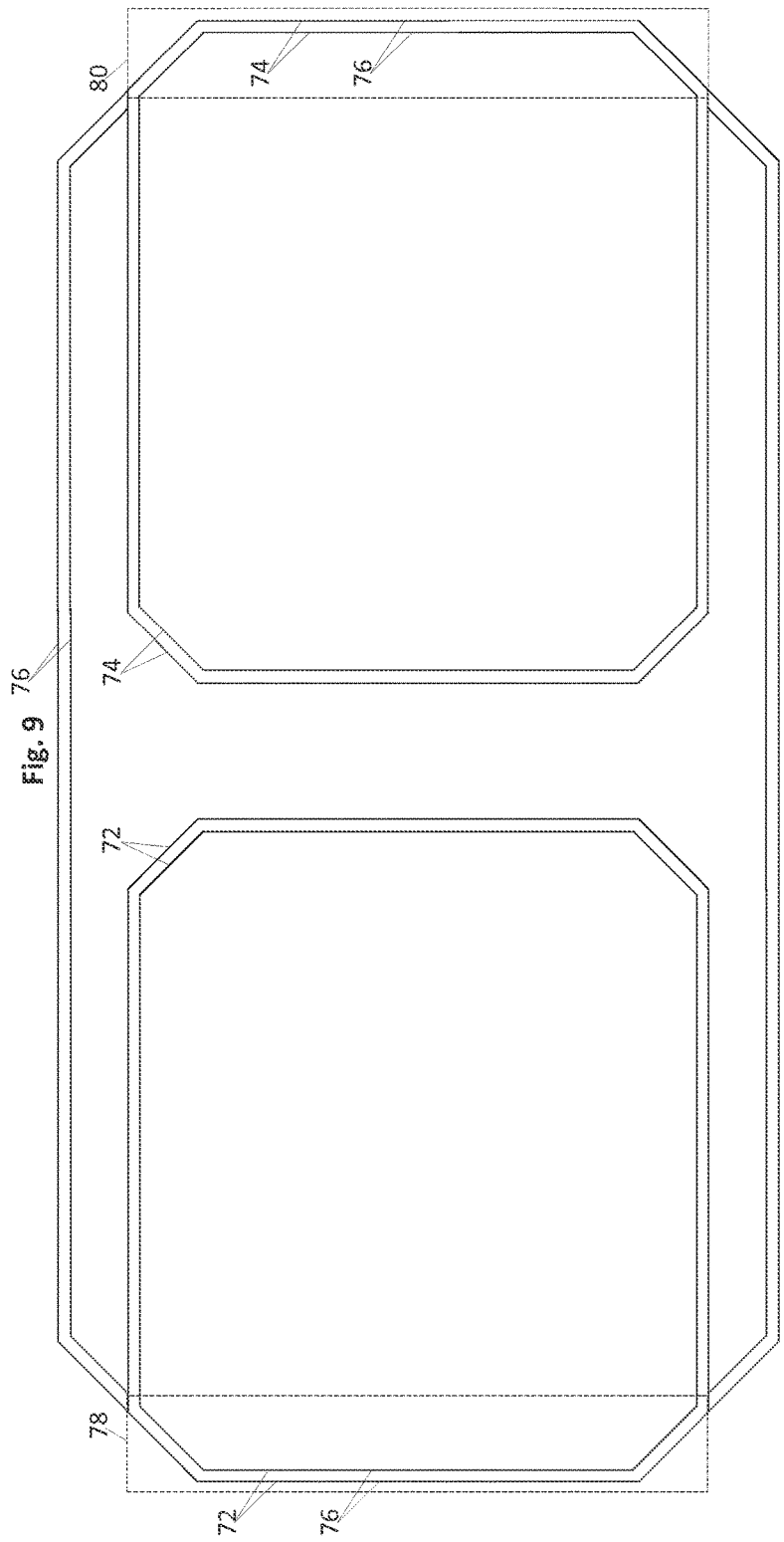

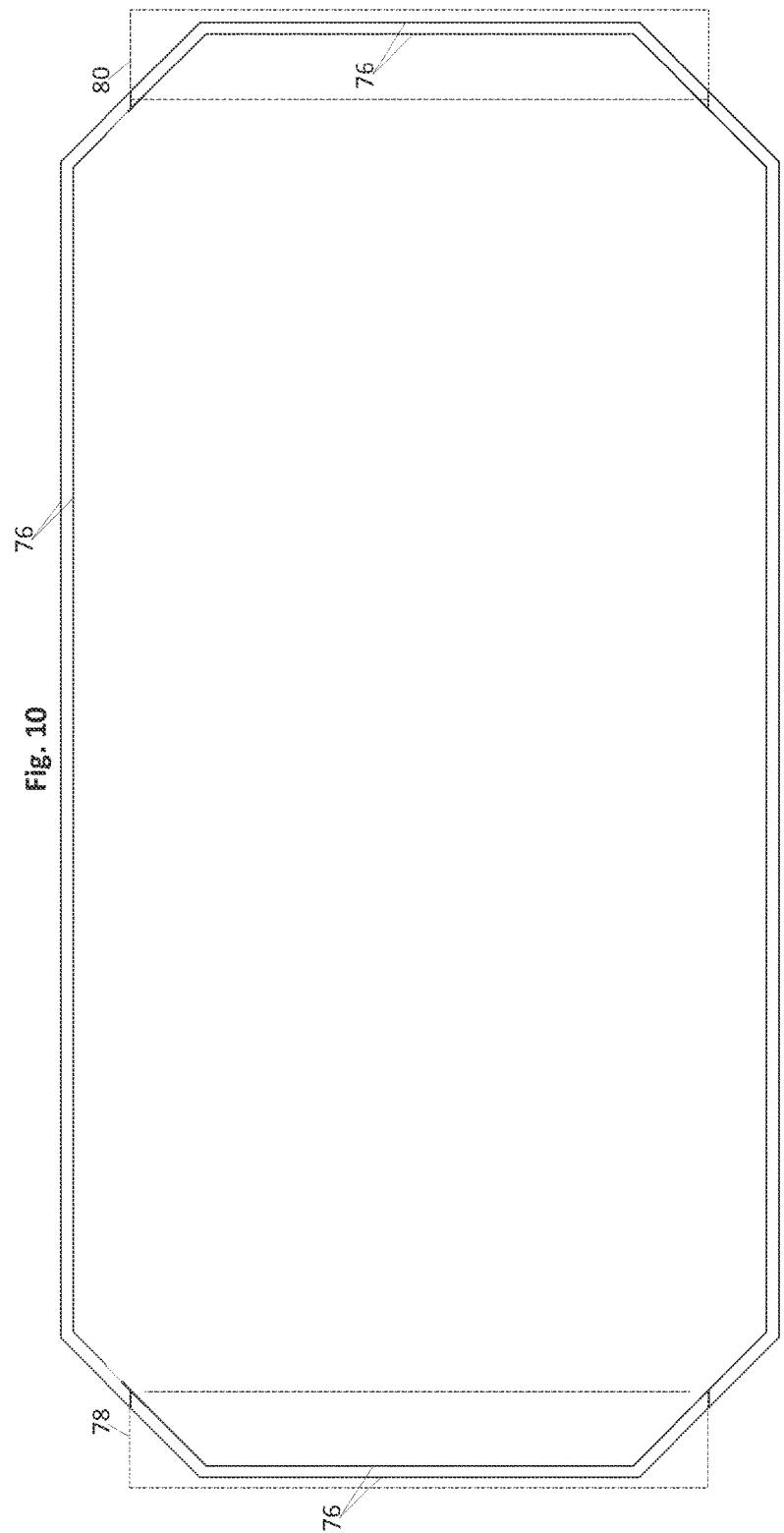

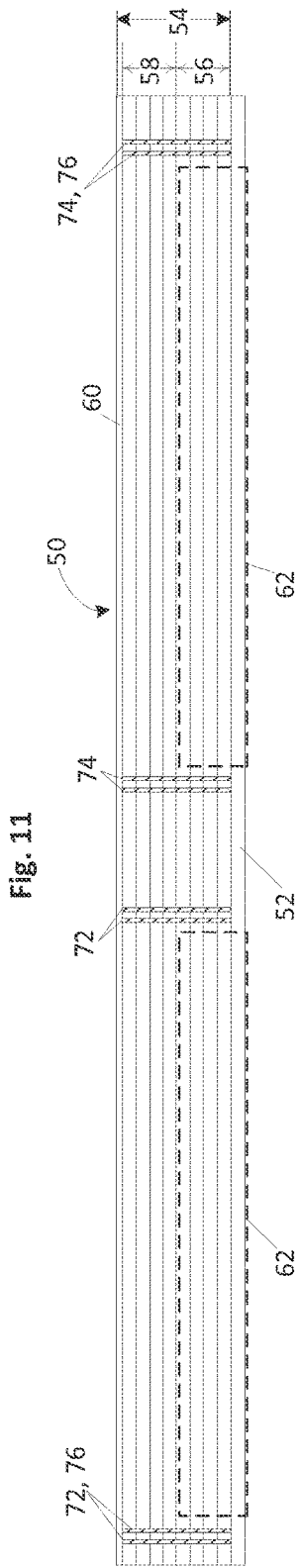

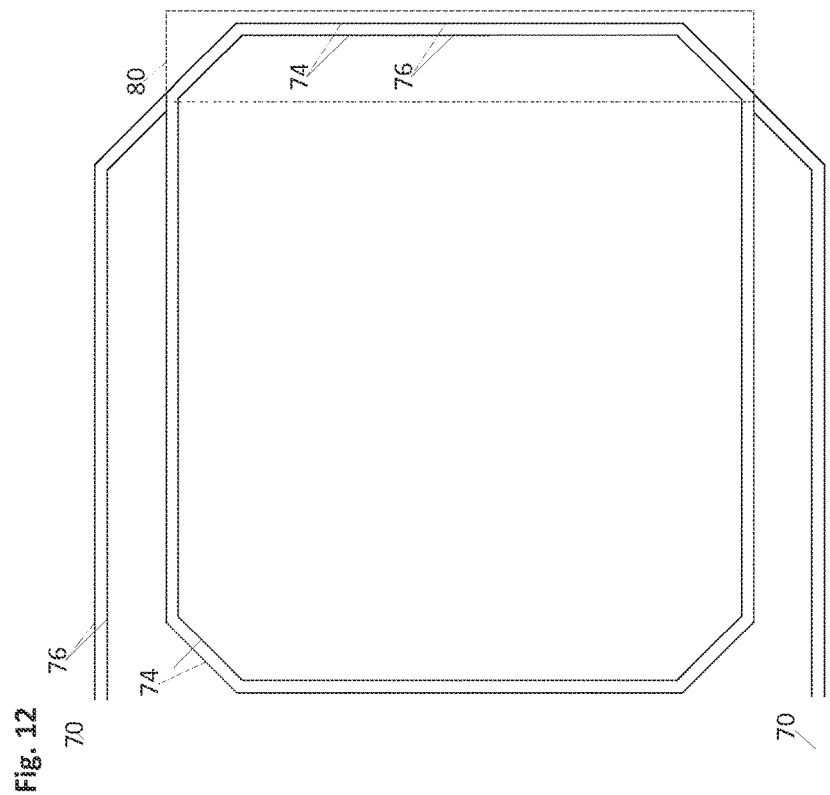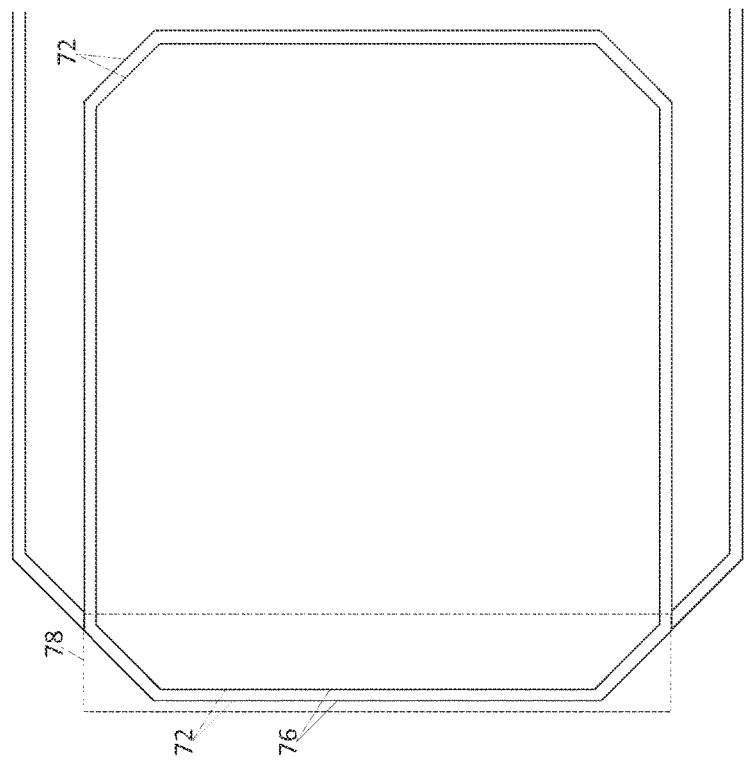

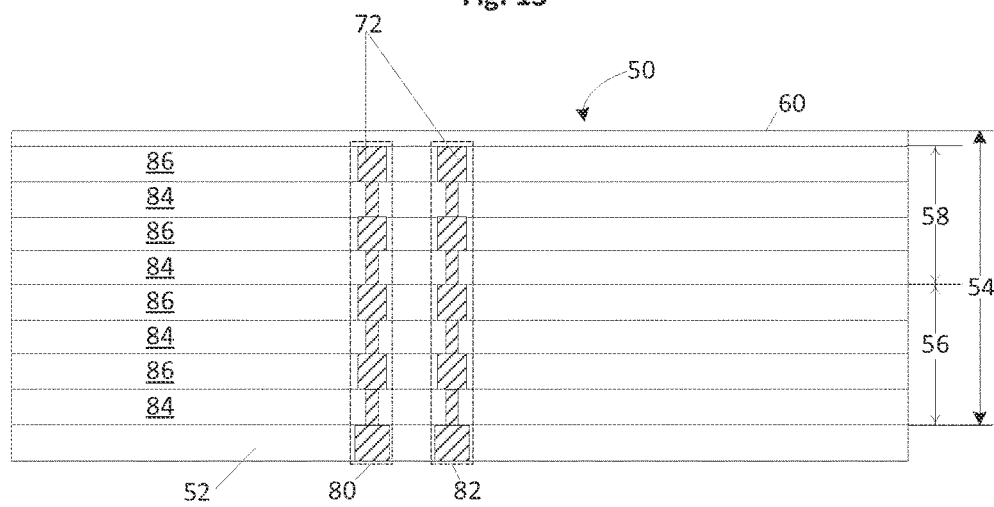

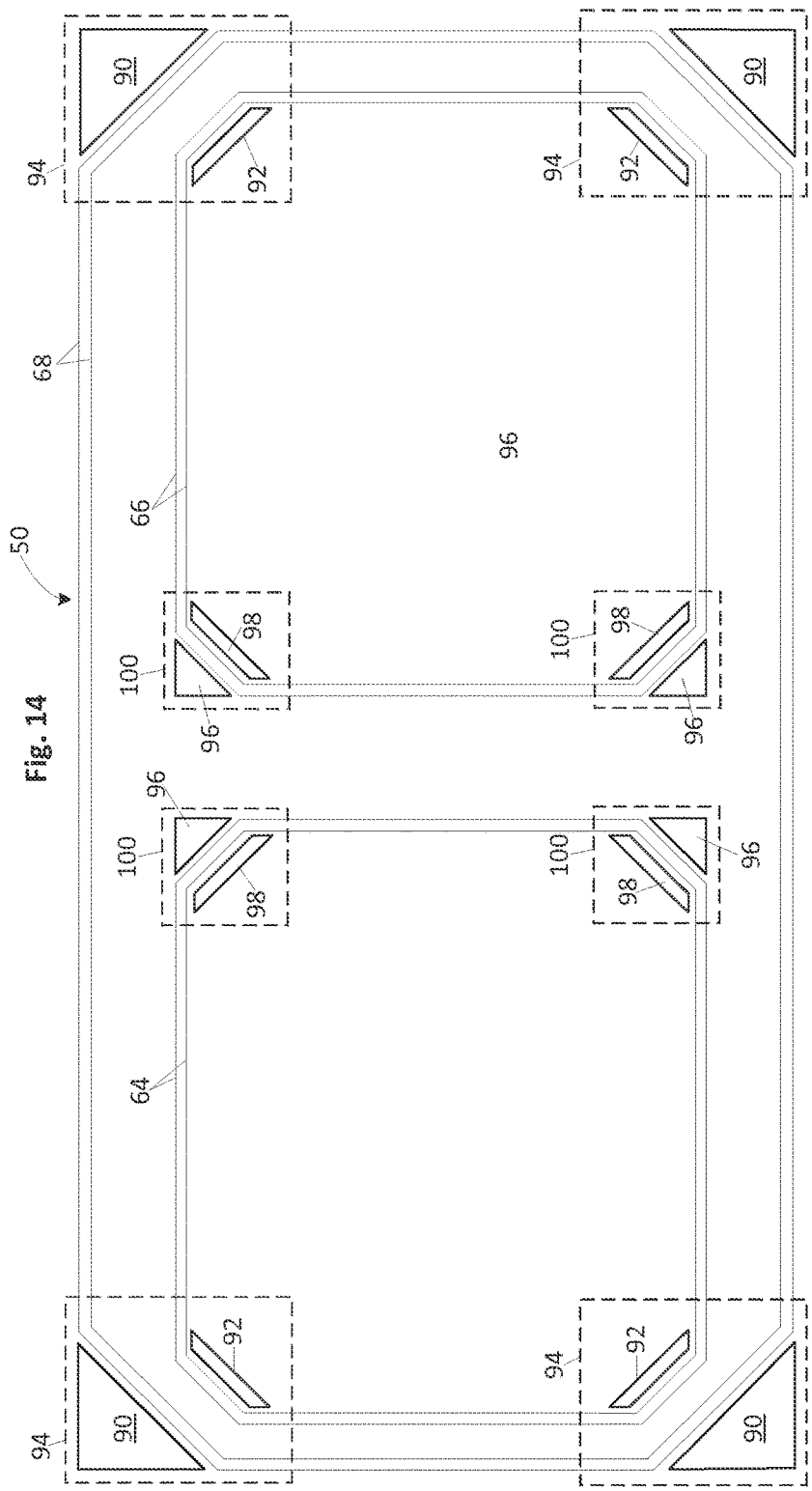

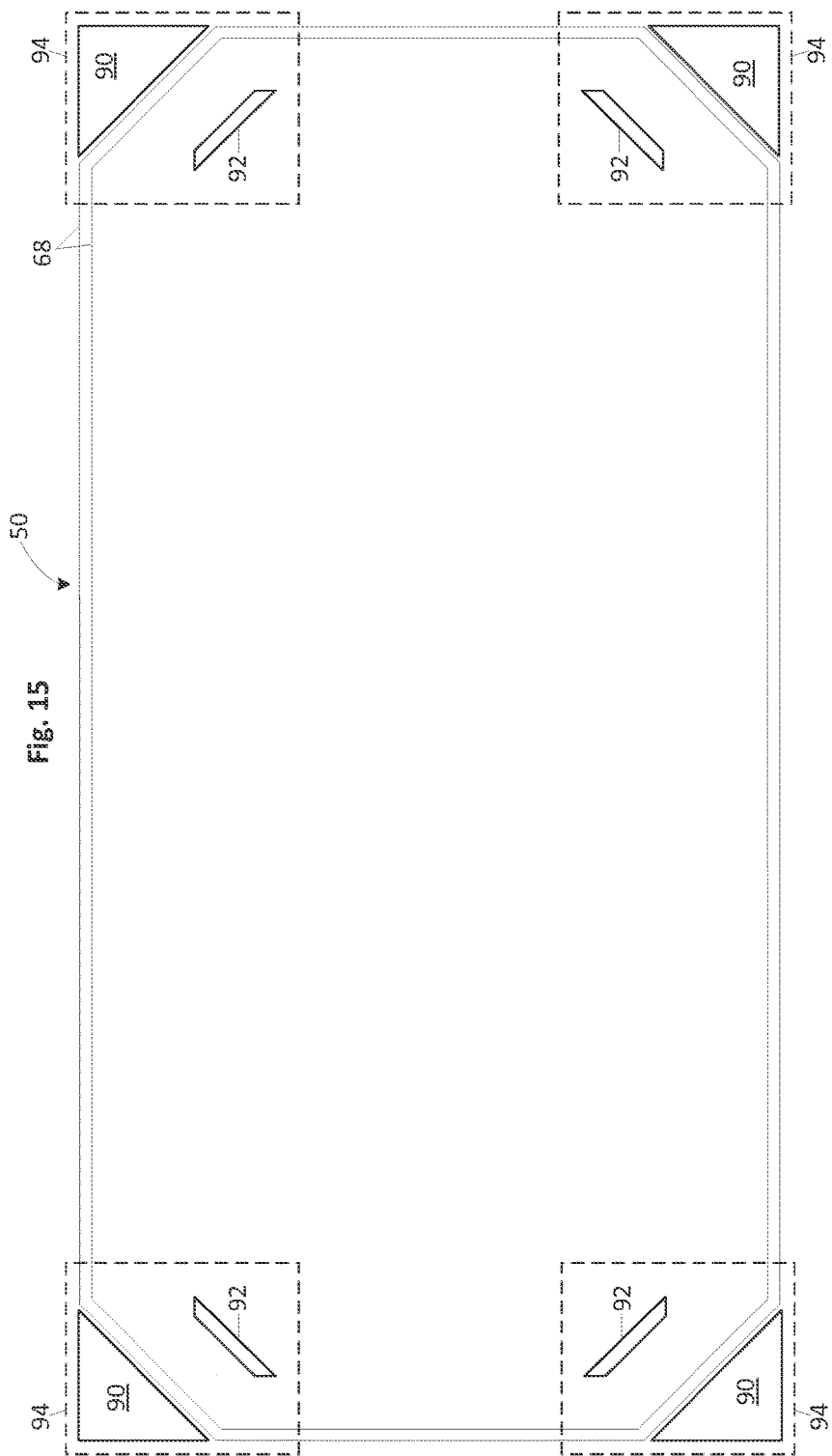

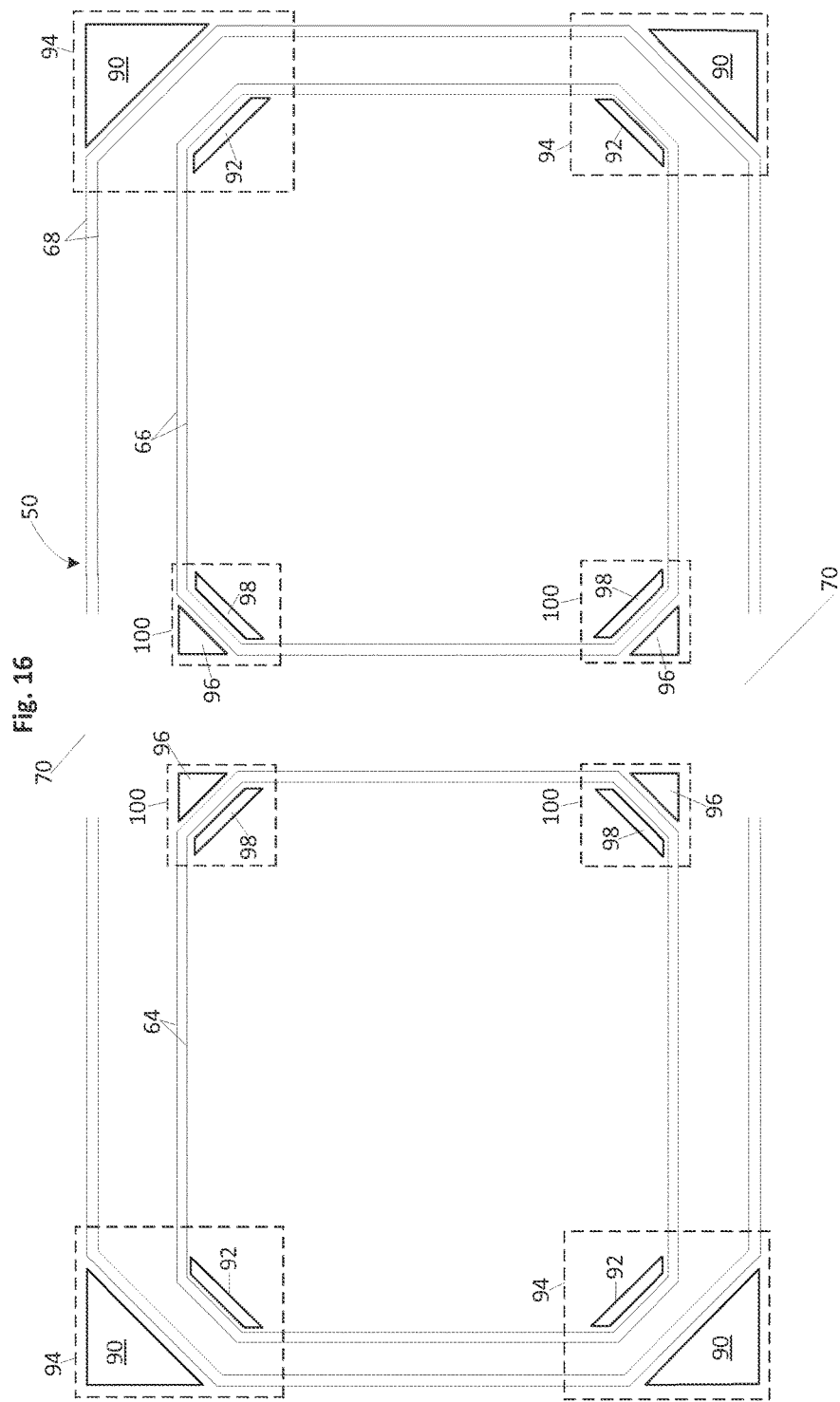

US 10,410,975 B1

PROCESSED WAFER OF SCALABLE ELECTRICAL CIRCUITS, METHOD FOR MAKING SAME, AND DEVICE COMPRISING SCALED ELECTRICAL CIRCUITS

FIELD

The present disclosure relates generally to the fabrication and design of semiconductor devices. More particularly, the present disclosure relates to processed semiconductor wafers that have a scalable electrical circuit design, to a method of making such wafers, and to a device comprising scaled electrical circuits.

BACKGROUND

The semiconductor device market often demands products that scale in some dimension (for example, the number of Flash channels on a Flash controller or the number of lanes on a PCIe switch). In some types of products, the architecture is such that it is possible to scale the product by electrically interconnecting two or more neighbor devices on a wafer and then dicing the wafer to obtain dies that comprise the interconnected neighbor devices. The interconnected neighbor devices perform as a scaled single device.

Advanced wafer processes that use, for example, low dielectric constant materials often require seal ring structures surrounding each individual device to ensure that cracks, generated when dicing a processed wafer into individual devices, do not propagate into the device's active region. The presence of such seal rings makes it difficult to electrically interconnect neighbor devices.

Therefore, improvements are desirable.

SUMMARY

In a first aspect, the present disclosure provides a processed semiconductor wafer that comprises initial layered elements that form: a first electrical circuit and a second electrical circuit; a first double-seal ring structure surrounding the first electrical circuit; a second double-seal ring structure surrounding the second electrical circuit; and a third double-seal ring structure surrounding first electrical circuit and the second electrical circuit. The processes semiconductor wafer also comprises additional layered elements formed on the initial layered elements.

In a second aspect, the present disclosure provides a method of fabricating a processed semiconductor wafer. The method comprises forming initial layered elements to define: a first electrical circuit; a first double-seal ring structure surrounding the first electrical circuit; a second electrical circuit; a second double-seal ring structure surrounding the second electrical circuit; and a third double-seal ring structure surrounding first electrical circuit and the second electrical circuit.

In a third aspect, the present disclosure provides a semiconductor device that comprises initial layered elements that form: a first electrical circuit and a second electrical circuit; a first double-seal ring structure surrounding the first electrical circuit; a second double-seal ring structure surrounding the second electrical circuit; and a third double-seal ring structure surrounding first electrical circuit and the second electrical circuit; and additional layered elements formed on the initial layered elements.

In a fourth aspect, the present disclosure provides a processed semiconductor wafer that comprises: initial layered elements that form: at least two electrical circuits; at least two double-seal ring structure, each double-seal ring structure surrounding a respective electrical circuit; and a common double-seal ring structure surrounding the at least two electrical circuits. The processed semiconductor wafer further comprises additional layered elements formed on the initial layered elements.

Other aspects and features of the present disclosure will become apparent to those ordinarily skilled in the art upon review of the following description of specific embodiments in conjunction with the accompanying figures.

BRIEF DESCRIPTION OF THE DRAWINGS

Embodiments of the present disclosure will now be described, by way of example only, with reference to the attached Figures.

FIG. 1 shows a processed semiconductor wafer in accordance with an embodiment of the present disclosure.

FIG. 2 shows an elevation, cross-sectional view of an embodiment of a processed wafer in accordance with the present disclosure.

FIG. 3 shows a top view of the processed wafer of FIG. 2 as it would appear in the absence of the upper portion of the plurality of layers and in the absence of the passivation layer.

FIG. 4 shows a top view of the processed wafer of FIG. 2 as it would appear in the absence of the passivation layer.

FIG. 5 shows an elevation, cross-sectional view of another embodiment of a processed wafer in accordance with the present disclosure.

FIG. 6 shows a top view of the processed wafer of FIG. 5 as it would appear in the absence of the passivation layer.

FIG. 7 shows a top view of the processed wafer of FIG. 5 as it would appear in the absence of the passivation layer, with the exterior double-seal ring defining openings.

FIG. 8 shows an elevation, cross-sectional view of another embodiment of a processed wafer in accordance with the present disclosure.

FIG. 9 shows a top view of the processed wafer of FIG. 8 as it would appear in the absence of the upper portion of the plurality of layers 54 and without the passivation layer.

FIG. 10 shows a top view of the processed wafer of FIG. 8 as it would appear without the passivation layer.

FIG. 11 shows an elevation, cross-sectional view of another embodiment of a processed wafer in accordance with the present disclosure.

FIG. 12 shows a top view of the processed wafer of FIG. 11 as it would appear in the absence of the passivation layer.

FIG. 13 shows an elevation, cross-sectional view of a double-seal ring of FIG. 11.

FIG. 14 shows a top view of the embodiment of the processed wafer of FIG. 2, with corner stress relief structures, as it would appear in the absence of the upper portion of the plurality of layers and in the absence of the passivation layer.

FIG. 15 shows a top view of the embodiment of the processed wafer of FIG. 2, with corner stress relief structures, as it would appear in the absence of the passivation layer.

FIG. 16 shows a top view of the embodiment of the processed wafer of FIG. 5, with corner stress relief structures, as it would appear in the absence of the passivation layer.

DETAILED DESCRIPTION

Figure 17:
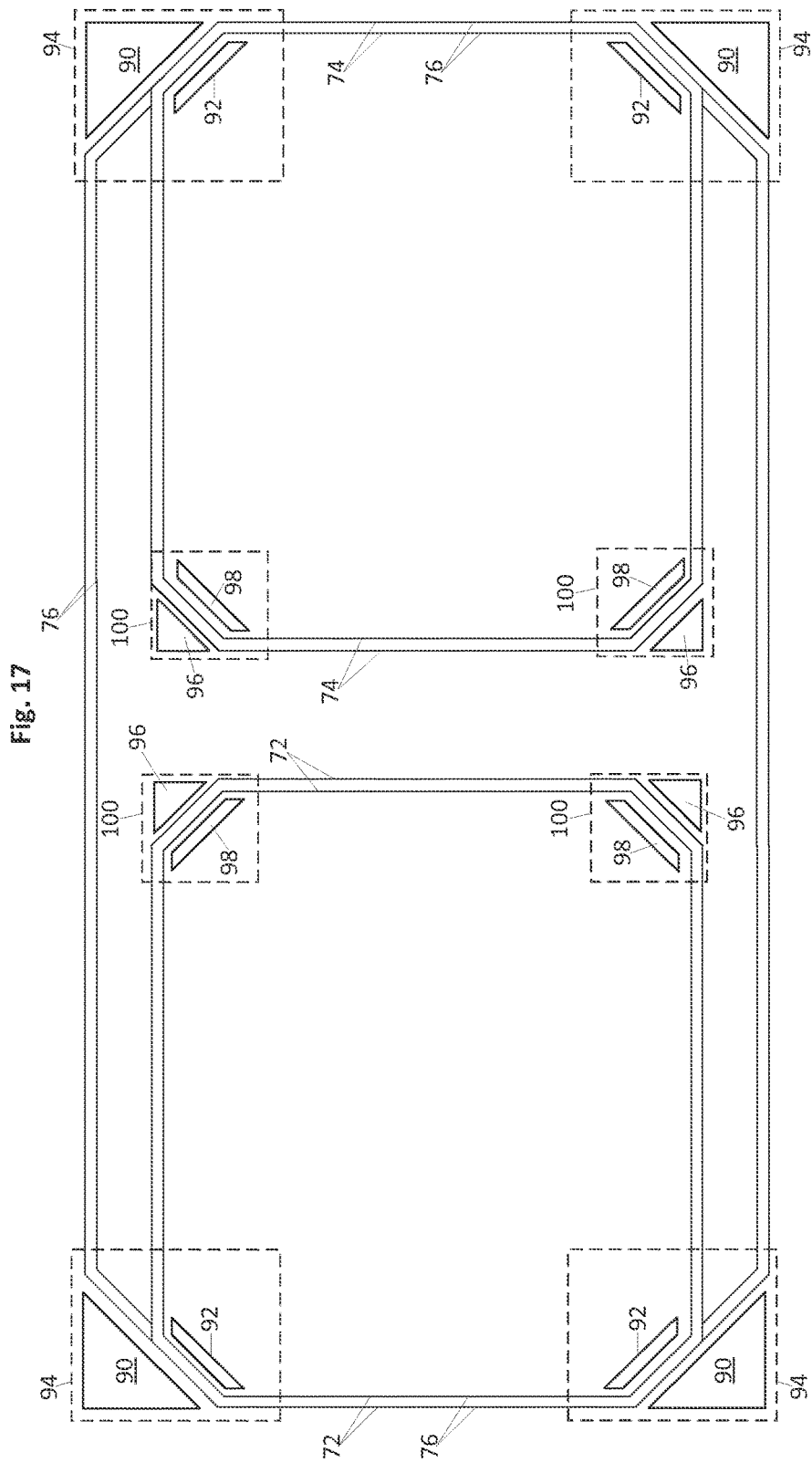
FIG. 17 shows a top view of the embodiment of the processed wafer of FIG. 8, with corner stress relief structures, as it would appear in the absence of the upper portion of the plurality of layers and in the absence of the passivation layer.

For the purpose of the present disclosure, a double-seal ring structure is a pair of spaced-apart seal rings. One of the seal rings is an interior seal ring surrounded by the other seal ring, which can be referred to as an exterior seal ring. The seal rings of the a double-seal ring structure can have any suitable geometry including, for example, a rectangular geometry, a square geometry, a polygon geometry, and a circular geometry. The seal rings can be made of any suitable type of material such as Tungsten, Copper, Aluminum, etc.

Generally, the present disclosure provides a processed wafer that has a substrate (a semiconductor substrate) and a plurality of layers formed on the substrate. The substrate and a lower portion of the plurality of layers define circuitry (electrical circuitry, electrical circuit) units that are scalable. The substrate and the lower portion of the plurality of layers also define first double-seal rings that each surrounds a respective circuitry unit and second double-seal rings that surround respective groups of neighbor circuitry units. In a first configuration, an upper portion of the plurality of layers interconnects neighbor circuitry units, the lower portion of the plurality of layers, and the upper portion of the plurality of layers define a second double-seal ring that surrounds the interconnected neighbor circuitry units. In a second configuration, the upper portion of the plurality of layers interconnects elements of each same circuitry unit but does not interconnect neighbor circuitry units. In the second configuration, the upper portion of the plurality of layers extends each first double-seal ring to surround the interconnections between the elements of each same circuitry unit. The present disclosure also provides a method for making such processed wafers.

FIG. 1 shows a processed wafer 50 in accordance with an embodiment of the present disclosure. The processed wafer 50 has defined thereon a plurality of circuitry units 62 that are scalable. That is, the processed wafer 50 can be formed to electrically connect to each other two or more circuitry units 62 to define a larger circuitry unit that has a performance metric or characteristic that scales with the number of interconnected circuitry units 62. Each square in FIG. 1 represents a circuitry unit 62. A circuitry unit 62 can also be referred to as an electrical circuit.

When the processed wafer 50 is formed to define individual circuitry units 62 that are not electrically connected to each other, the processed wafer 50 can be cut to separate individual circuitry units 62 from each other. When the processed wafer 50 is formed to define scaled circuitry units, the processed wafer can be cut to separate from each other scaled circuitry units. Whether or not individual circuitry units 62 are electrically connected to each other, the processed wafer 50 has defined therein, in a portion of layers formed on the substrate, a same arrangement of double-seal rings.

FIG. 2 shows an elevation, cross-sectional view of an embodiment of a processed wafer 50 in accordance with the present disclosure. For clarity purposes, only two circuitry units 62 are shown in FIG. 2. The processed wafer 50 comprises a substrate 52 (e.g., a silicon substrate) and a plurality layers 54 formed on the substrate 52. The plurality of layers 54 includes a lower portion 56 of layers and an upper portion 58 of layers. The plurality of layers 54 can also include a passivation layer 60.

The substrate 52 and the lower portion 56 of layers define the two circuitry units 62, which are scalable. That is, the two circuitry units 62 can be connected to each other to form a larger circuitry unit that has a performance metric or characteristic that scales with the number of interconnected circuitry units 62, in this case, two.

In the embodiment of FIG. 2, the lower portion 56 of the plurality of layers 54 defines a double-seal ring 64 that surrounds one of the circuitry units 62, and a double-seal ring 66 that surrounds the other circuitry unit 62. The upper portion 56 of the plurality of layers also defines interconnections (not shown) between the circuit units 62. That is, in this embodiment, the two circuitry units 62 are electrically connected to each other and form a scaled circuitry unit. The upper portion 56 of the plurality of layers can also define electrical contacts (not shown) for connection of the circuitry units 62 to electrical/electronic equipment. In order to mitigate the risk of cracks being generated in the scaled circuit unit formed by the two circuit units 62 upon cutting the processed wafer 50 to separate from each other neighbor scaled circuitry units, a double-seal ring 68 is formed to surround the scaled circuit unit.

FIG. 3 shows a top view of the processed wafer 50 as it would appear in the absence of the upper portion 58 of the plurality of layers 54 and in the absence of the passivation layer 60. The line I-I in FIG. 3 refers back to the elevation, cross-sectional view of FIG. 2. FIG. 2 and FIG. 3 show the double-seal ring 68, defined by the plurality of layers 54 that surrounds, in the lower portion portions 56 of the plurality of layers 54, the double-seal rings 64 and 66. The double-seal ring 68 extends through the upper portion 58 of the plurality of layers 54 and thereby surrounds the scaled circuit unit defined by the interconnected circuit units 62. As will be understood by the skilled worker, in the present example, and in examples presented below, having the third double-seal ring 68 surround more than two circuitry units 62 is also within the scope of the present disclosure. For example, four 8-channel NAND Flash controller circuit units on a processed wafer can be electrically connected to each other to form a 32-channel NAND Flash controller. In this case all four electrical circuit units are surrounded by a common double-seal ring structure equivalent to the third double-seal ring 68 of FIGS. 2 and 3.

FIG. 4 shows a top view of the processed wafer 50 as it would appear in the absence of the passivation layer 60. As shown in FIG. 4, only the double-seal ring 68 extends through the plurality of layers 54 to surround the scaled circuit unit formed in the substrate 52 and the lower portion 56 of the plurality of layers 54.

The presence of the circuitry units 62 and of the double-seal ring structures 64, 66 and 68 in the lower portion 56 of the plurality of layers 54 provides flexibility in that the production of scaled circuitry units (electrically interconnected circuitry units) or individual circuitry units can use the same masks for the lower portion 56 of plurality of layers 54.

FIG. 5 shows an elevation, cross-sectional view of another embodiment of the present disclosure where individual circuitry units 62 are not electrically interconnected to each other. As in the embodiment of FIG. 2, in the embodiment of FIG. 5, the lower portion 56 of the plurality of layers 54 defines a double-seal ring 64 that surrounds one of the circuitry units 62, and a double-seal ring 66 that surrounds the other circuitry unit 62. The upper portion 58 of the plurality of layers 54 extends the double-seal rings 64 and 66 from the lower portion 56 of the plurality of layers 54 to the passivation layer 60. Additionally, the upper portion 68 of the plurality of layers 54 can define electrical contacts (not shown) for connection of the circuitry units 62 to electrical/electronic equipment.

As in the embodiment of FIG. 2, the lower portion 56 of the plurality of layers 54 defines a double-seal ring 68 that surrounds, in the lower portion 56 of the plurality of layers 54, the double-seal rings 64 and 66. In the embodiment of FIG. 5, the upper portion 58 of the plurality of layers 54 extends the double-seal ring 68 from the lower section 56 of the plurality of layers to the passivation layer 60.

FIG. 6 shows a top view of the processed wafer 50 of FIG. 5 as it would appear in the absence of the passivation layer 60. In FIG. 6, the double-seal ring 68 surrounds both the double-seal ring 64 and the double-seal ring 66. This need not be the case. For example, FIG. 7 shows a top view of another embodiment of a processed wafer 50 of FIG. 5 as it would appear in the absence of the passivation layer 60 but this time, with the double-seal ring 68 defining openings 70, which extends through the upper portion 58 of plurality of layers 54. The presence of the openings 70 in the upper portion 58 of the plurality of layers 54 allows for greater ease when cutting the processed wafer 50 to separate (physically separate) the circuitry units 62 from each other. In a further embodiment, the double-seal ring 68 can be completely absent from the upper portion 58 of the plurality of layers 54.

A top view of the embodiment of FIG. 5 as it would appear in the absence of the upper portion 58 of the plurality of layers 54 and in the absence of the passivation layer 60, would look exactly as in FIG. 6.

FIG. 8 shows an elevation, cross-sectional view of a processed wafer 50 in accordance with another embodiment of the present disclosure. Only two circuitry units 62 are shown in FIG. 8. The processed wafer 50 comprises a substrate 52 (e.g., a silicon substrate) and a plurality of layers 54 formed on the substrate 52. The plurality of layers 54 includes a lower portion 56 of layers and an upper portion 58 of layers. The plurality of layers 54 can also include a passivation layer 60.

The substrate 52 and the lower portion 56 of layers define the two circuitry units 62, which are scalable. That is, the two circuitry units 62 can be connected to each other to form a larger circuitry unit that has a performance metric or characteristic that scales with the number of interconnected circuitry units 62, in this case, two.

In the embodiment of FIG. 8, the substrate 52 and the lower portion 56 of the plurality of layers 54 defines a double-seal ring 72 that surrounds one of the circuitry units 62, and a double-seal ring 74 that surrounds the other circuitry unit 62. The upper portion 56 of the plurality of layers also defines interconnections (not shown) between the circuitry units 62. That is, in this embodiment, the circuitry units 62 are electrically connected to each other and form a scaled circuitry unit. In order to mitigate the risk of cracks being generated in the scaled circuitry unit formed by the two circuit units 62 upon cutting the processed wafer 50 to separate from each other neighbor scaled circuitry units, the lower portion 54 and the upper portion 56 of the plurality of layers 54 define a double-seal ring 76 that surrounds the scaled circuit unit. Further, the upper portion 56 of the plurality of layers can also define electrical contacts (not shown) for connection of the circuitry units 62 to electrical/electronic equipment.

FIG. 9 shows a top view of the processed wafer 50 of FIG. 8 as it would appear in the absence of the upper portion 58 of the plurality of layers 54 and without the passivation layer 60. In contrast to the embodiment of FIG. 2, the embodiment of FIGS. 8 and 9 uses common double-seal ring structures to define the double-seal rings 72, 74, and 76. In the present embodiment, one of the common double-seal ring structures is shown at reference numeral 78 and is part of the double-seal ring 72 and of the double-seal ring 76. The other common double-seal ring structure is shown at reference numeral 80 and is part of the double-seal ring 74 and of the double-seal ring 76. The double-seal ring 72 surrounds one of the circuitry units 62, the double-seal ring 74 surrounds the other circuit unit 62, and the double-seal ring 76 surround both the circuitry units 62.

FIG. 10 shows a top view of the processed wafer 50 of FIG. 8 as it would appear without the passivation layer 60. As shown in FIG. 10, only the double-seal ring 76 extends through the plurality of layers 54 to surround the scaled circuit unit formed in the substrate 52 and the lower portion 56 of the plurality of layers 54.

FIG. 11 shows an elevation, cross-sectional view of another embodiment of a processed wafer 50 the present disclosure where individual circuitry units 62 are not electrically interconnected to each other. As in the embodiment of FIG. 8, in the embodiment of FIG. 11, the substrate 52 and the lower portion 56 of the plurality of layers 54 defines a double-seal ring 72 that surrounds one of the circuitry units 62, and a double-seal ring 74 that surrounds the other circuitry unit 62. The upper portion 58 of the plurality of layers 54 extends the double-seal rings 72 and 74 from the lower portion 56 of the plurality of layers 54 to the passivation layer 60. Additionally, the upper portion 68 of the plurality of layers 54 can define electrical contacts (not shown) for connection of the circuitry units 62 to electrical/electronic equipment.

A top view of the processed wafer 50 of FIG. 11, as it would appear in the absence of the upper portion 58 of the plurality of layers 54 and in the absence of the passivation layer 60, would be same as that shown in FIG. 9. FIG. 12 shows a top view of the processed wafer of FIG. 11 as it would appear in the absence of the passivation layer 60. In this embodiment, as the circuitry units 62 are not electrically interconnected to each other, i.e. as there are no scaled circuitry units, there is no need to have a double-seal ring that surrounds scaled circuitry units. As such, in the present embodiment, the upper portion 58 of the plurality of layers 54 does close the double-seal ring 76. Rather, the upper portion 58 of the plurality of layers 54 defines openings 70 in the double-seal ring 76. The presence of the openings 70 in the upper portion 58 of the plurality of layers 54 allows for greater ease when cutting the processed wafer 50 to separate the circuitry units 62. In a further embodiment, except for the common double-seal ring structures 78 and 80, the double-seal ring 76 can be completely absent from the upper portion 58 of the plurality of layers 54.

FIG. 13 shows an elevation, cross-sectional view of the double-seal ring 72 of FIG. 11. As shown in FIG. 13, the double-seal ring 72 is defined by two spaced-apart columns 80 and 82, which are made of a conductor material. The columns are separated by dielectric material. The columns 80 and 82 extend from the substrate 52, through a series of via layers 84 and interconnect layers 86, up to the passivation layer 60. Although four via layers 84 and four interconnect layers 86 are shown, there can be any suitable number of such layers and, there can be any suitable number of layers in the plurality of layers 52. Further, the lower portion 56 of the plurality of layers 54 can contain any suitable number of layers and, the upper portion 58 of the plurality of layers 54 can contain any suitable number of layers.

As will be understood by the skilled worker, the layers of the plurality of layers 54 can define elements such as poly gates, contacts, aluminum pads, and any other suitable type of elements. The double-seal ring structures can be made of, for example, tungsten, copper, aluminum or any other suitable material. The material, in the layers, that fills space between elements can be an oxide material, e.g., a silicon dioxide material, fluorinated silicate glass, low dielectric constant material, or any other suitable material. Any suitable technique/process or group of techniques/processes can be used to fabricate the processed wafer 50. Such techniques include, e.g., epitaxial growth of layers, non-epitaxial growth of layers, dry etching, dual-damascene processes, chemical-mechanical planarization processes, or any other suitable technique/process.

As is known in the art, processed wafers designed be cut up to produce integrated circuit dies often have defined thereon corner stress relief structures near intersecting cutting lanes. Examples of cutting lanes are shown at reference numeral 30, at FIG. 1. Stress relief structures may also be referred to as sacrificial regions. The present disclosure includes corner stress relief adapted to the various double-seal ring configurations described above.

FIG. 14 shows a top view of the embodiment of the processed wafer 50 of FIG. 2, with corner stress relief structures, as it would appear in the absence of the upper portion 58 of the plurality of layers 54 and in the absence of the passivation layer 60. FIG. 14 shows corner stress relief structures 90 and 92 formed at the corner regions 94 of the double-seal ring 68. FIG. 14 also shows corner stress relief structures 96 and 98 formed at the corner regions 100 of the double-seal rings 64 and 66.

FIG. 15 shows a top view of the embodiment of the processed wafer 50 of FIG. 2, with corner stress relief structures, as it would appear in the absence of the passivation layer 60. FIG. 15 shows corner stress relief structures 90 and 92 formed at the corner regions 94 of the double-seal ring 68. As the circuitry units 62 are electrically interconnected to each other, the upper region 58 of the plurality of layers is not required to extend the corner stress relief structures 96 and 98 from the lower portion 56 of the plurality of layers to the passivation layer 60.

FIG. 16 shows a top view of the embodiment of the processed wafer 50 of FIG. 5, with corner stress relief structures, as it would appear in the absence of the passivation layer 60. FIG. 16 shows corner stress relief structures 90 and 92 formed at the corner regions 94 of the double-seal ring 68. As the circuitry units 62 are not electrically interconnected to each other, the upper region 58 of the plurality of layers do extend the corner stress relief regions 96 and 98 from the lower portion 56 of the plurality of layers to the passivation layer 60.

FIG. 17 shows a top view of the embodiment of the processed wafer 50 of FIG. 8, with corner stress relief structures, as it would appear in the absence of the upper portion 58 of the plurality of layers 54 and in the absence of the passivation layer 60. FIG. 17 shows corner stress relief structures 90 and 92 formed at the corner regions 94 of the double-seal ring 76. FIG. 17 also shows corner stress relief structures 96 and 98 formed at the corner regions 100 of the double-seal rings 72 and 74.

Figure 18:
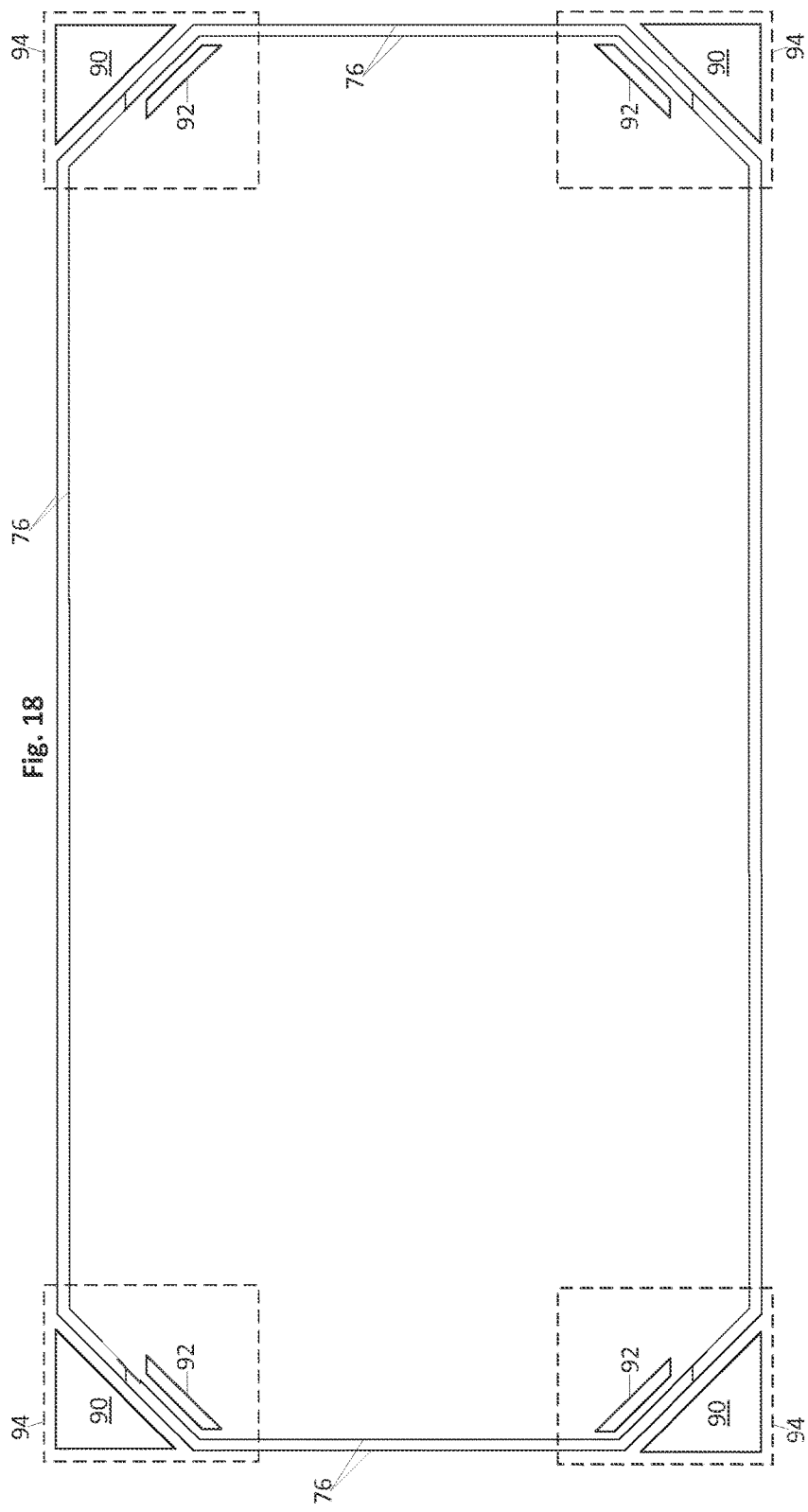
FIG. 18 shows a top view of the embodiment of the processed wafer 50 of FIG. 8, with corner stress relief structures, as it would appear in the absence of the passivation layer.

FIG. 18 shows a top view of the embodiment of the processed wafer 50 of FIG. 8, with corner stress relief structures, as it would appear in the absence of the passivation layer 60. FIG. 18 shows corner stress relief structures 90 and 92 formed at the corner regions 94 of the double-seal ring 76. As the circuitry units 62 are electrically interconnected to each other, the upper region 58 of the plurality of layers is not required to extend the corner stress relief regions 96 and 98 (shown at FIG. 17) from the lower portion 56 of the plurality of layers to the passivation layer 60.

Figure 19:
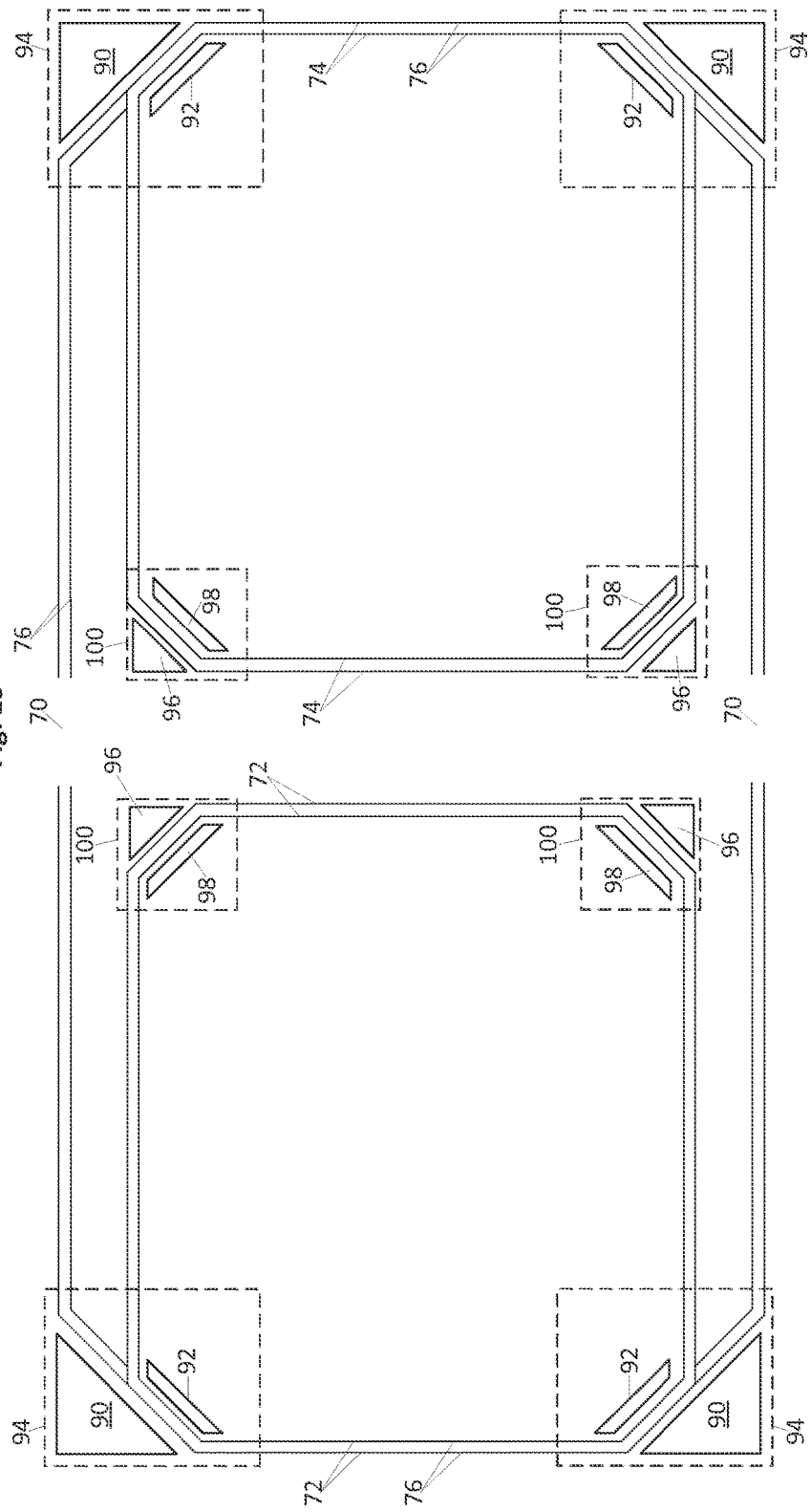
FIG. 19 shows a top view of the embodiment of the processed wafer of FIG. 11, with corner stress relief structures, as it would appear in the absence of the passivation layer.

FIG. 19 shows a top view of the embodiment of the processed wafer 50 of FIG. 11, with corner stress relief structures, as it would appear in the absence of the passivation layer 60. FIG. 19 shows corner stress relief structures 90 and 92 formed at the corner regions 94 of the double-seal ring 76. As the circuitry units 62 are not electrically interconnected to each other, the upper region 58 of the plurality of layers does extend the corner stress relief regions 96 and 98 from the lower portion 56 of the plurality of layers to the passivation layer 60.

Figure 20:
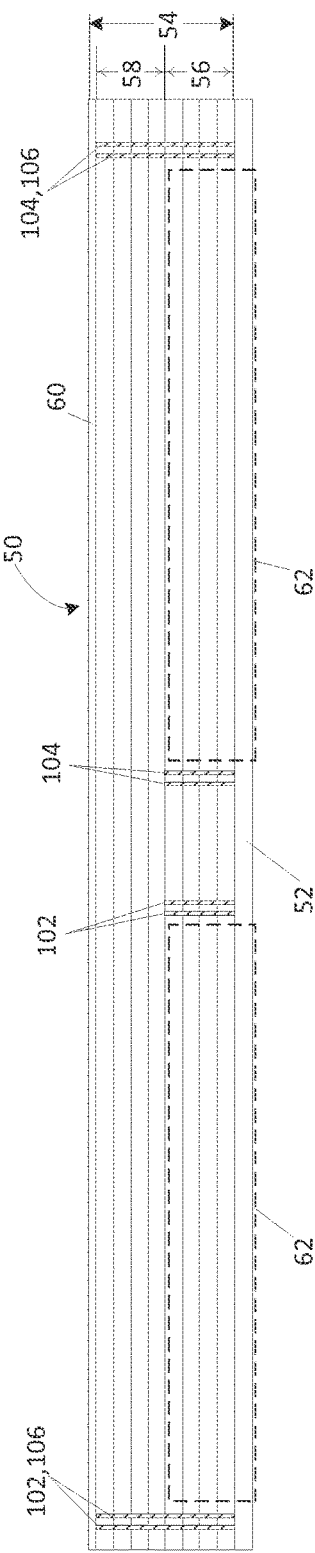
FIG. 20 shows an elevation, cross-sectional view of a processed wafer in accordance with another embodiment of the present disclosure.

FIG. 20 shows an elevation, cross-sectional view of a processed wafer 50 in accordance with another embodiment of the present disclosure. Only two circuitry units 62 are shown in FIG. 20. The processed wafer 50 comprises a substrate 52 (e.g., a silicon substrate) and a plurality of layers 54 formed on the substrate 52. The plurality of layers 54 includes a lower portion 56 of layers and an upper portion 58 of layers. The plurality of layers 54 can also include a passivation layer 60.

The substrate 52 and the lower portion 56 of layers define the two circuitry units 62, which are scalable. That is, the two circuitry units 62 can be connected to each other to form a larger circuitry unit that has a performance metric or characteristic that scales with the number of interconnected circuitry units 62, in this case, two.

In the embodiment of FIG. 20, the substrate 52 and the lower portion 56 of the plurality of layers 54 defines a double-seal ring 102 that surrounds one of the circuitry units 62, and a double-seal ring 104 that surrounds the other circuitry unit 62. The upper portion 56 of the plurality of layers also defines interconnections (not shown) between the circuitry units 62. That is, in this embodiment, the circuitry units 62 are electrically connected to each other and form a scaled circuitry unit. In order to mitigate the risk of cracks being generated in the scaled circuitry unit formed by the two circuit units 62 upon cutting the processed wafer 50 to separate from each other neighbor scaled circuitry units, the lower portion 54 and the upper portion 56 of the plurality of layers 54 define a double-seal ring 106 that surrounds the scaled circuit unit. Further, the upper portion 56 of the plurality of layers can also define electrical contacts (not shown) for connection of the circuitry units 62 to electrical/electronic equipment.

Figure 21:
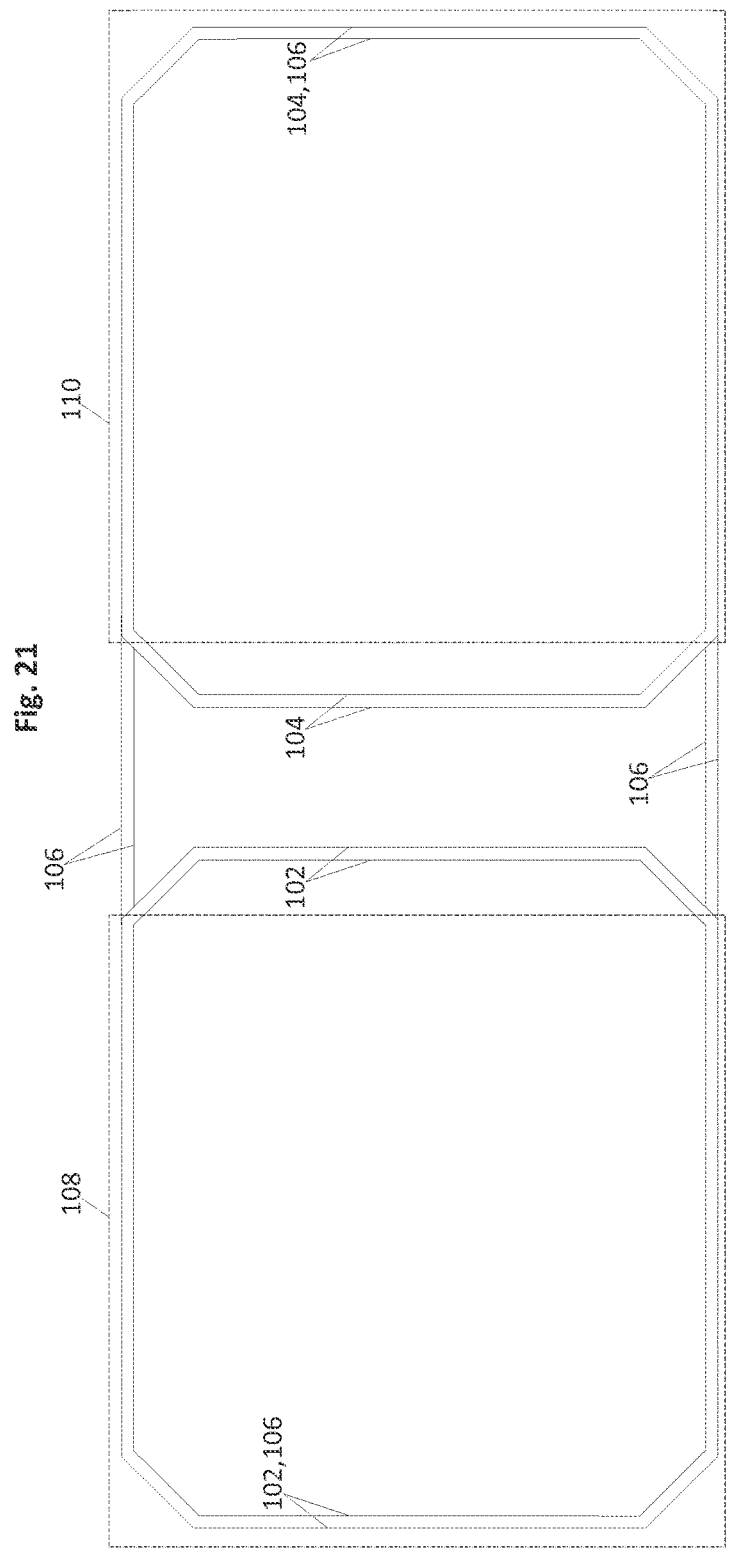
FIG. 21 shows a top view of the processed wafer of FIG. 20 as it would appear in the absence of the upper portion of the plurality of layers and without the passivation layer.

FIG. 21 shows a top view of the processed wafer 50 of FIG. 20 as it would appear in the absence of the upper portion 58 of the plurality of layers 54 and without the passivation layer 60. The embodiment of FIGS. 20 and 21 uses common double-seal ring structures to define the double-seal rings 102, 104, and 106. In the present embodiment, one of the common double-seal ring structures is shown at reference numeral 108 and is part of the double-seal ring 102 and of the double-seal ring 106. The other common double-seal ring structure is shown at reference numeral 110 and is part of the double-seal ring 104 and of the double-seal ring 106. The double-seal ring 102 surrounds one of the circuitry units 62, the double-seal ring 104 surrounds the other circuitry unit 62, and the double-seal ring 106 surround both circuitry units 62.

Figure 22:
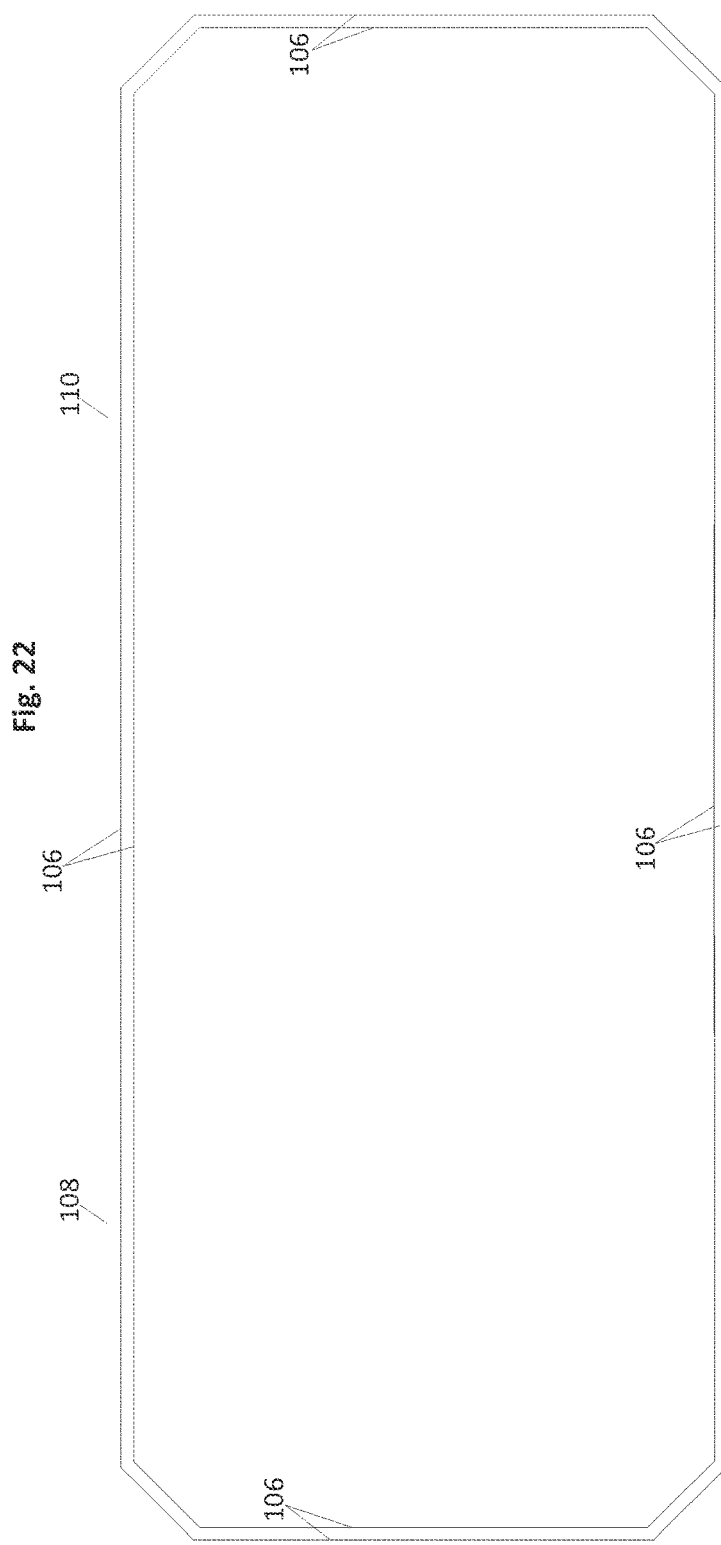
FIG. 22 shows a top view of the processed wafer of FIG. 20 as it would appear without the passivation layer.

FIG. 22 shows a top view of the processed wafer 50 of FIG. 20 as it would appear without the passivation layer 60. As shown in FIG. 22, only the double-seal ring 106 extends through the plurality of layers 54 to surround the scaled circuit unit formed in the substrate 52 and the lower portion 56 of the plurality of layers 54.

Figure 23:
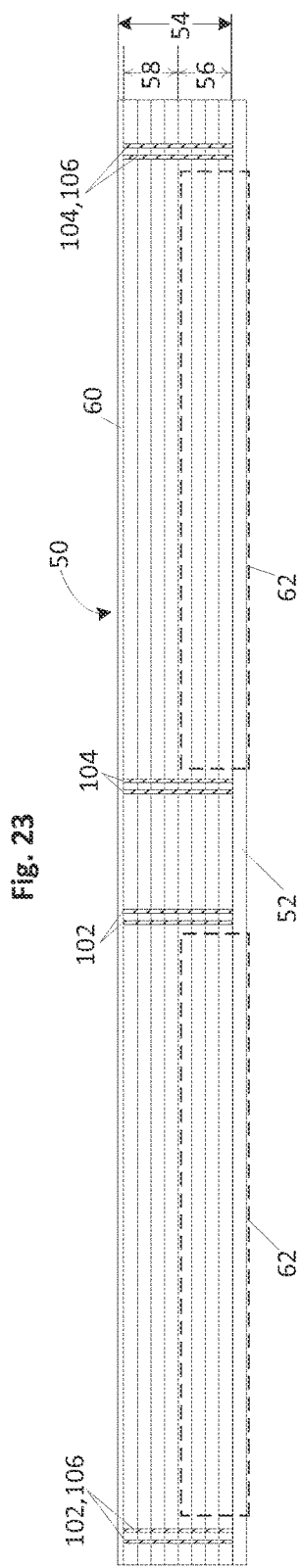
FIG. 23 shows an elevation, cross-sectional view of another embodiment of a processed wafer the present disclosure where individual circuitry units are not electrically interconnected to each other.

FIG. 23 shows an elevation, cross-sectional view of another embodiment of a processed wafer 50 the present disclosure where individual circuitry units 62 are not electrically interconnected to each other. As in the embodiment of FIG. 20, in the embodiment of FIG. 23, the substrate 52 and the lower portion 56 of the plurality of layers 54 define a double-seal ring 102 that surrounds one of the circuitry units 62, and a double-seal ring 104 that surrounds the other circuitry unit 62. The upper portion 58 of the plurality of layers 54 extends the double-seal rings 102 and 104 from the lower portion 56 of the plurality of layers 54 to the passivation layer 60. Additionally, the upper portion 68 of the plurality of layers 54 can define electrical contacts (not shown) for connection of the circuitry units 62 to electrical/electronic equipment.

Figure 24:
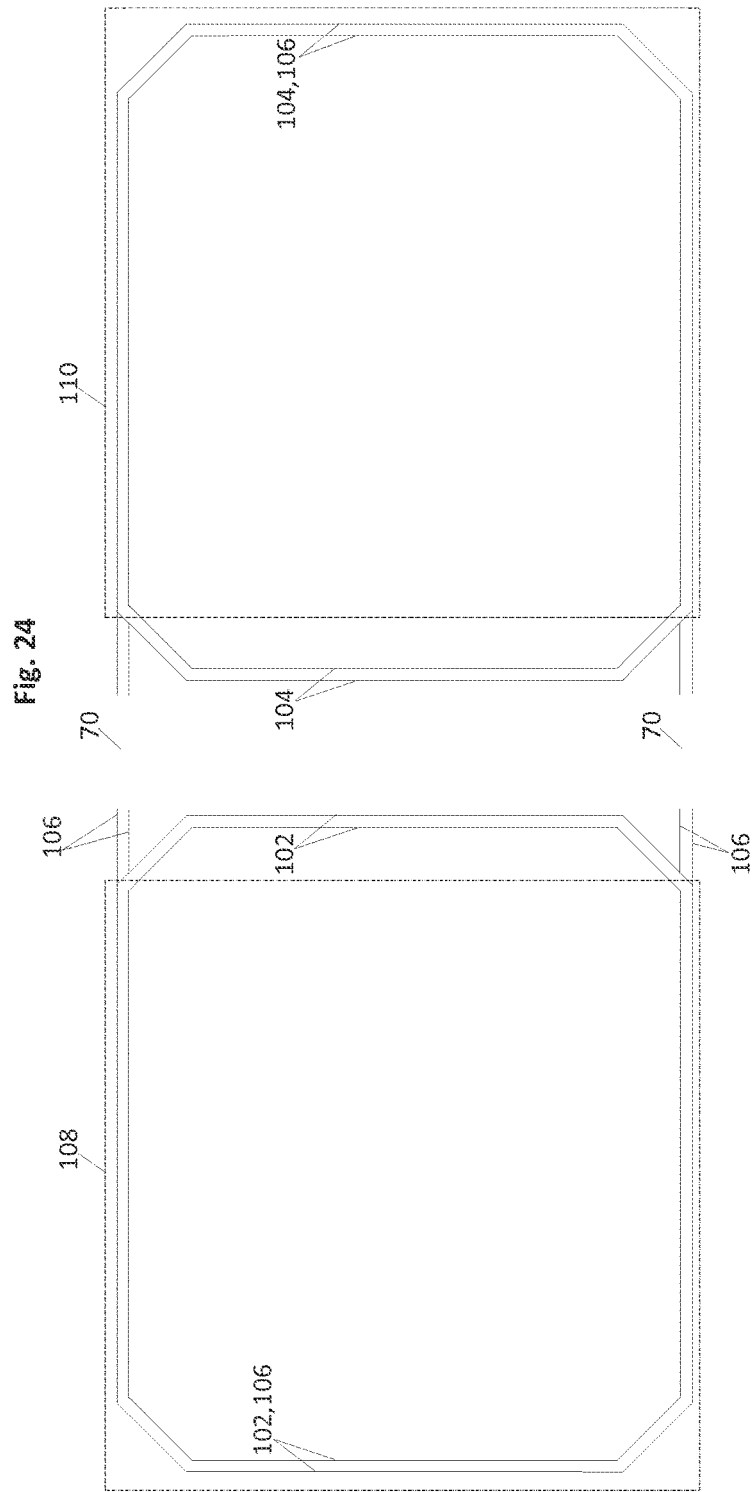
FIG. 24 shows a top view of the processed wafer of FIG. 23 as it would appear in the absence of the passivation layer.

A top view of the processed wafer 50 of FIG. 23, as it would appear in the absence of the upper portion 58 of the plurality of layers 54 and in the absence of the passivation layer 60, would be same as that shown in FIG. 21. FIG. 24 shows a top view of the processed wafer of FIG. 23 as it would appear in the absence of the passivation layer 60. In this embodiment, as the circuitry units 62 are not electrically interconnected to each other, i.e. as there are no scaled circuitry units, there is no need to have a double-seal ring that surrounds scaled circuitry units. As such, in the present embodiment, the upper portion 58 of the plurality of layers 54 does close the double-seal ring 106. Rather, the upper portion 58 of the plurality of layers 54 defines openings 70 in the double-seal ring 106. The presence of the openings 70 in the upper portion 58 of the plurality of layers 54 allows for greater ease when cutting the processed wafer 50 to separate the circuitry units 62. In a further embodiment, except for the common double-seal ring structures 78 and 80, the double-seal ring 106 can be completely absent from the upper portion 58 of the plurality of layers 54.

As will be understood by the skilled worker, the embodiments of FIGS. 20 through 24 can also comprise stress relief structures in corner regions (intersecting cutting lanes) in order to reduce the risk of the occurrence of cracks during cutting of the processed wafer.

Figure 25:
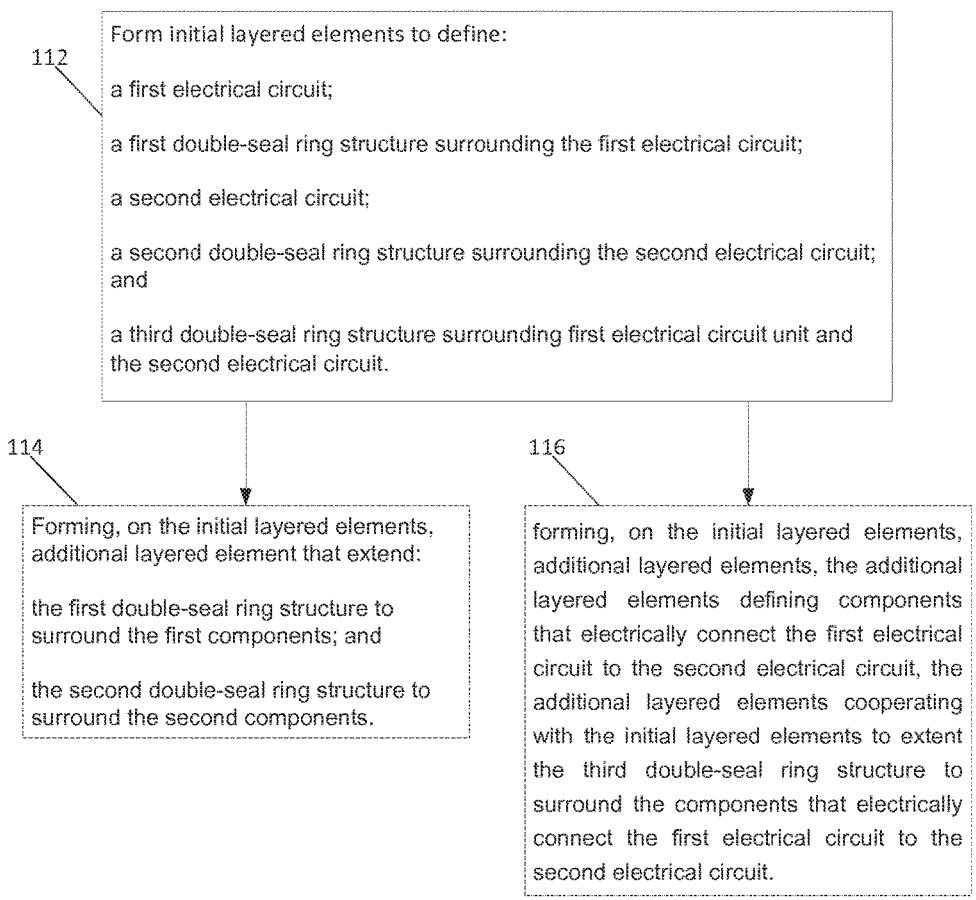
FIG. 25 shows a flowchart of an embodiment of a method in accordance with the present disclosure.

FIG. 25 shows a flowchart of an embodiment of a method in accordance with the present disclosure. At action 112, initial layered elements are formed using any suitable fabrication process or processes. The initial layered elements can include, for example the substrate 52 and the layers in the lower portion 56 of layers shows at FIG. 2 and FIG. 5. The layered elements are formed to define a first electric circuit and a first double-seal ring circuit that surrounds the first electrical circuit. The layered elements are formed to also define a second electrical circuit and a second double-seal ring circuit that surrounds the second electrical circuit. An example of the first electrical circuit and an example of the second electrical circuit are shown at FIG. 2 and FIG. 5, at reference numeral 62. An example of the first double-seal ring and of the second double-seal ring is shown at FIGS. 2 and 3, at reference numerals 64 and 66. Further, the layered elements are formed to also define a third double-seal ring structure that surrounds the first electrical circuit and the second electrical circuit. An example of a third double-seal ring is shown at FIGS. 2 and 3, at reference numeral 68. Another example of a third double-seal ring is shown at FIG. 5 and FIG. 6, reference numeral 68.

Optionally, at action 114, the method can include forming, on the initial layered elements, additional layered elements that extend the first double-seal ring structure to surround the first components; and that extend the second double-seal ring structure to surround the second components. An example of such additional layered elements is shown at FIG. 5, reference numeral 58.

Optionally, and in lieu of action 114, at action 116, the method can include forming, on the initial layered elements, additional layered elements. The additional layered elements define components that electrically connect the first electrical circuit to the second electrical circuit. Further, the additional layered elements cooperate with the initial layered elements to extent the third double-seal ring structure to surround the components that electrically connect the first electrical circuit to the second electrical circuit. An example of such additional elements is shown at FIG. 2, reference numeral 58.

Figure 26:
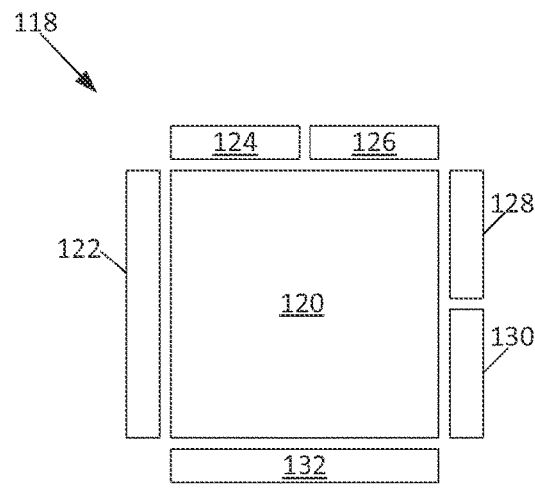
FIG. 26 shows an example of a 16-channel NAND Flash controller

FIG. 26 shows an example of a 16 channel NAND Flash controller 118, which includes a 16 channel device 120, input/output ports 122, flash 124, DDR4 memory 126, a PCIe port 128, input/output ports 130, and flash memory 132. The NAND Flash controller 118 serves as a low capacity Flash controller.

Figure 27:
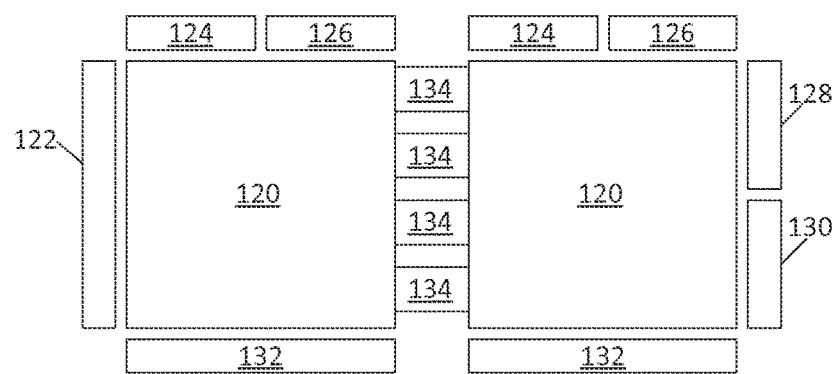
FIG. 27 shows an example of two 16-channel NAND Flash controller electrically connected to each other, in accordance with the present disclosure, to form a 32-channel NAND Flash controller

FIG. 27 shows an example of a 32 channel NAND Flash controller 133, which includes two 16 channel devices 120, input/output ports 122, flash 124, DDR4 memory 126, a PCIe port 128, input/output ports 130, and flash memory 132. The two 16 channel devices 120 are joined by electrical connections 134. The NAND Flash controller 133 serves as a 32 channel as a high capacity Flash controller. That is, the performance metric "number of channels" of the NAND Flash controller 118 has been double by interconnecting the two, 16 channel devices 120.

In general, and in the context of the present disclosure, two components are "electrically connected" when an electrical change caused by or affecting one component (such as a change in voltage or current) can result in an electrical change in the other component, or when an electrical signal sent by one component can be received by the other component. The two components need not be directly electrically connected (that is, there may be other components interposed between them), and they may be, but need not be, proximate to one another. "Electrically connected" also includes the concept that components may be physically connected but the electrical circuit connections between them may be broken or completed by, for example, switching circuitry.

Further, in the context of the present disclosure, an electrical circuit is defined as a plurality of components where some, or all, of the components are electrically connected to each other.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

The above-described embodiments are intended to be examples only. Alterations, modifications and variations can be effected to the particular embodiments by those of skill in the art. The scope of the claims should not be limited by the particular embodiments set forth herein, but should be construed in a manner consistent with the specification as a whole.

What is claimed is:

1. A processed semiconductor wafer comprising:
   initial layered elements forming:
      a first electrical circuit and a second electrical circuit;
      a first double-seal ring structure surrounding the first electrical circuit;
      a second double-seal ring structure surrounding the second electrical circuit, the second double-seal ring structure being distinct from the first double-seal structure, each seal ring of the first double-seal ring structure surrounding only the first electrical circuit, each seal ring of the second double-seal ring structure surrounding only the second electrical circuit; and
      a third double-seal ring structure surrounding the first electrical circuit and the second electrical circuit, the third double-seal ring structure including a section that is also part of the first double-seal ring structure, the third double-seal ring structure having an inner seal ring and an outer seal ring, the outer seal ring being a continuous seal ring that surrounds the inner seal ring;
      and
   additional layered elements formed on the initial layered elements.

2. The processed semiconductor wafer of claim 1 wherein:
   the additional layered elements cooperate with the initial layered elements to:
   extend the first double-seal ring structure to surround the first electrical circuit; and
   extend the second double-seal ring structure to surround the second electrical circuit.

3. The processed semiconductor wafer of claim 1 wherein:
   the additional layered elements define components that electrically connect the first electrical circuit to the second electrical circuit; and
   the additional layered elements cooperate with the initial layered elements to extend the third double-seal ring structure to surround the components that electrically connect the first electrical circuit to the second electrical circuit.

4. The processed semiconductor wafer of claim 3 wherein:
   each of the first electrical circuit and the second electrical circuit has a first performance metric value;
   the electrically connected first electrical circuit and second electrical circuit define a scaled electrical circuit that has twice the performance metric value.

5. The processed semiconductor wafer of claim 1 wherein the third double-seal ring structure includes a section that is also part of the second double-seal ring structure.

6. The processed semiconductor wafer of claim 1 wherein the initial layered elements and the additional layered elements define:
   locations at which the processed semiconductor device is to be cut; and
   stress relief structures adjacent the cutting lanes and adjacent at least one of the first double-seal ring structure, the second double-seal ring structure, and the third double-seal ring structure.

7. A method of fabricating a processed semiconductor wafer, the method comprising:
   forming initial layered elements to define:
      a first electrical circuit;
      a first double-seal ring structure surrounding the first electrical circuit;
      a second electrical circuit;
      a second double-seal ring structure surrounding the second electrical circuit, the second double-seal ring structure being distinct from the first double-seal structure, each seal ring of the first double-seal ring structure surrounding only the first electrical circuit, each seal ring of the second double-seal ring structure surrounding only the second electrical circuit; and
      a third double-seal ring structure surrounding first electrical circuit and the second electrical circuit, the third double-seal ring structure including layered elements that are also part of the first double-seal ring structure, the third double-seal ring structure having an inner seal ring and an outer seal ring, the outer seal ring being a continuous seal ring that surrounds the inner seal ring.

8. The method of claim 7 further comprising:
   forming, on the initial layered elements, additional layered elements, the additional layered elements extending:
      the first double-seal ring structure to surround the first electrical circuit; and
      the second double-seal ring structure to surround the second electrical circuit.

9. The method of claim 7 further comprising forming, on the initial layered elements, additional layered elements, the additional layered elements defining components that electrically connect the first electrical circuit to the second electrical circuit, the additional layered elements cooperating with the initial layered elements to extend the third double-seal ring structure to surround the components that electrically connect the first electrical circuit to the second electrical circuit.

10. The method of claim 9 wherein:
each of the first electrical circuit and the second electrical circuit formed by the initial layered elements has a same first performance metric value;
the electrically connected first electrical circuit and second electrical circuit define a scaled electrical circuit that has twice the performance metric value.

11. The method of claim 7 further comprising the initial layered elements forming a section of the third double-seal ring structure that is also part of the second double-seal ring structure.

12. The method of claim 7 further comprising the initial layered elements and the additional layered elements defining:
cutting lanes that delineate locations, on the processed semiconductor wafer, where the processed semiconductor device is to be cut; and
stress relief structures adjacent the cutting lanes and adjacent at least one of the first double-seal ring structure, the second double-seal ring structure, and the third double-seal ring structure.

13. A semiconductor device comprising:
initial layered elements forming:
a first electrical circuit and a second electrical circuit;
a first double-seal ring structure surrounding the first electrical circuit;
a second double-seal ring structure surrounding the second electrical circuit, the second double-seal ring structure being distinct from the first double-seal structure, each seal ring of the first double-seal ring structure surrounding only the first electrical circuit, each seal ring of the second double-seal ring structure surrounding only the second electrical circuit; and
a third double-seal ring structure surrounding first electrical circuit and the second electrical circuit, the third double-seal ring structure including a section that is also part of the first double-seal ring structure, the third double-seal ring structure having an inner seal ring and an outer seal ring, the outer seal ring being a continuous seal ring that surrounds the inner seal ring;
and
additional layered elements formed on the initial layered elements.

14. The device of claim 13 wherein:
the additional layered elements define components that electrically connect the first electrical circuit to the second electrical circuit; and
the additional layered elements cooperate with the initial layered elements to extend the third double-seal ring structure to surround the components that electrically connect the first electrical circuit to the second electrical circuit.

15. The device of claim 14 wherein:
each of the first electrical circuit and the second electrical circuit has a first performance metric value;
the electrically connected first electrical circuit and second electrical circuit define a scaled electrical circuit that has twice the performance metric value.

16. A processed semiconductor wafer comprising:
initial layered elements forming:
at least two electrical circuits;
at least two double-seal ring structures, each double-seal ring structure of the at least two distinct double-seal ring structures surrounding a respective different electrical circuit of the at least two electrical circuits, each seal ring of each double-seal ring structure of the at least two distinct double-seal ring structures surrounding only a respective single one of said at least two electrical circuits;
and
a common double-seal ring structure surrounding the at least two electrical circuits, the common double-seal ring structure having a section that is also part of one of the at least two double-seal ring structures, the common double-seal ring structure having an inner seal ring and an outer seal ring, the outer seal ring being a continuous seal ring that surrounds the inner seal ring;
and
additional layered elements formed on the initial layered elements.

* * * * *